(12) United States Patent
Son et al.

(10) Patent No.: US 9,589,674 B2
(45) Date of Patent: Mar. 7, 2017

(54) METHOD OF OPERATING MEMORY DEVICE AND METHODS OF WRITING AND READING DATA IN MEMORY DEVICE

(71) Applicant: Samsung Electronics Co., Ltd., Suwon-si (KR)

(72) Inventors: Jong-Pil Son, Seongnam-si (KR); Young-Soo Sohn, Seoul (KR); Uk-Song Kang, Seongnam-si (KR); Chul-Woo Park, Yongin-si (KR); Jung-Hwan Choi, Hwaseong-si (KR); Won-Il Bae, Seongnam-si (KR); Kyo-Min Sohn, Yongin-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 241 days.

(21) Appl. No.: 14/305,095

(22) Filed: Jun. 16, 2014

(65) Prior Publication Data
US 2015/0067448 A1 Mar. 5, 2015

(30) Foreign Application Priority Data

Sep. 5, 2013 (KR) ........................ 10-2013-0106808

(51) Int. Cl.
| | | |
|---|---|---|
| G11C 29/00 | (2006.01) | |
| G11C 29/52 | (2006.01) | |
| G06F 11/10 | (2006.01) | |
| G11C 29/04 | (2006.01) | |

(52) U.S. Cl.
CPC .......... *G11C 29/52* (2013.01); *G06F 11/1048* (2013.01); *G11C 2029/0411* (2013.01)

(58) Field of Classification Search
CPC .. G06F 11/10; G06F 11/1008; G06F 11/1044; G06F 11/1048; G06F 11/1068; G06F 11/1076; G11C 2029/0411; G11C 29/52; H05K 999/99; B41J 2/155; B41J 29/38; B41J 5/30
See application file for complete search history.

(56) References Cited

U.S. PATENT DOCUMENTS

| | | | | |
|---|---|---|---|---|
| 6,697,992 B2 * | 2/2004 | Ito | ........................ | G06F 11/1008 360/47 |
| 7,266,759 B2 * | 9/2007 | Koga | .................. | G06F 11/1008 714/762 |
| 7,366,971 B2 * | 4/2008 | Kikutake | ............ | G06F 11/1032 714/703 |
| 7,458,004 B2 | 11/2008 | Takahashi | | |
| 7,603,592 B2 | 10/2009 | Sekiguchi et al. | | |

(Continued)

FOREIGN PATENT DOCUMENTS

JP 2008-217926 A 9/2008

*Primary Examiner* — Albert Decady
*Assistant Examiner* — Enamul M Kabir
(74) *Attorney, Agent, or Firm* — Muir Patent Law, PLLC

(57) ABSTRACT

In a method of operating a memory device, a command and a first address from a memory controller are received. A read code word including a first set of data corresponding to the first address, a second set of data corresponding to a second address and a read parity data is read from a memory cell array of the memory device. Corrected data are generated by operating error checking and correction (ECC) using an ECC circuit based on the read cord word.

17 Claims, 20 Drawing Sheets

(56) References Cited

U.S. PATENT DOCUMENTS

| | | | |
|---|---|---|---|
| 8,001,450 B2* | 8/2011 | Onishi | G06F 11/1048 714/752 |
| 8,151,173 B2 | 4/2012 | Hirose et al. | |
| 8,286,054 B2 | 10/2012 | Kawabata | |
| 2005/0229077 A1* | 10/2005 | Takahashi | G06F 11/1008 714/758 |
| 2009/0089646 A1* | 4/2009 | Hirose | G06F 11/1048 714/766 |
| 2009/0119567 A1* | 5/2009 | Kawabata | G06F 11/1032 714/763 |
| 2010/0088475 A1* | 4/2010 | Alba Pinto | G06F 12/0207 711/149 |
| 2012/0311406 A1* | 12/2012 | Ratnam | G06F 11/10 714/768 |
| 2014/0201590 A1* | 7/2014 | Coker | G11B 20/1217 714/758 |

* cited by examiner

FIG. 4

| LDQ0 0 | LDQ0 1 | LDQ0 2 | LDQ0 3 | LDQ0 4 | LDQ0 5 | LDQ0 6 | LDQ0 7 |
|---|---|---|---|---|---|---|---|
| LDQ1 0 | LDQ1 1 | LDQ1 2 | LDQ1 3 | LDQ1 4 | LDQ1 5 | LDQ1 6 | LDQ1 7 |
| LDQ2 0 | LDQ2 1 | LDQ2 2 | LDQ2 3 | LDQ2 4 | LDQ2 5 | LDQ2 6 | LDQ2 7 |
| LDQ3 0 | LDQ3 1 | LDQ3 2 | LDQ3 3 | LDQ3 4 | LDQ3 5 | LDQ3 6 | LDQ3 7 |
| UDQ0 0 | UDQ0 1 | UDQ0 2 | UDQ0 3 | UDQ0 4 | UDQ0 5 | UDQ0 6 | UDQ0 7 |
| UDQ1 0 | UDQ1 1 | UDQ1 2 | UDQ1 3 | UDQ1 4 | UDQ1 5 | UDQ1 6 | UDQ1 7 |
| UDQ2 0 | UDQ2 1 | UDQ2 2 | UDQ2 3 | UDQ2 4 | UDQ2 5 | UDQ2 6 | UDQ2 7 |
| UDQ3 0 | UDQ3 1 | UDQ3 2 | UDQ3 3 | UDQ3 4 | UDQ3 5 | UDQ3 6 | UDQ3 7 |
| PARITY DQ0 0 | PARITY DQ0 1 | PARITY DQ0 2 | PARITY DQ0 3 | PARITY DQ0 4 | PARITY DQ0 5 | PARITY DQ0 6 | NOT USE |

FIG. 10

| LDQ0 0 | LDQ0 1 | LDQ0 2 | LDQ0 3 | LDQ0 4 | LDQ0 5 | LDQ0 6 | LDQ0 7 |
|---|---|---|---|---|---|---|---|
| LDQ1 0 | LDQ1 1 | LDQ1 2 | LDQ1 3 | LDQ1 4 | LDQ1 5 | LDQ1 6 | LDQ1 7 |
| LDQ2 0 | LDQ2 1 | LDQ2 2 | LDQ2 3 | LDQ2 4 | LDQ2 5 | LDQ2 6 | LDQ2 7 |
| LDQ3 0 | LDQ3 1 | LDQ3 2 | LDQ3 3 | LDQ3 4 | LDQ3 5 | LDQ3 6 | LDQ3 7 |
| LDQ4 0 | LDQ4 1 | LDQ4 2 | LDQ4 3 | LDQ4 4 | LDQ4 5 | LDQ4 6 | LDQ4 7 |
| LDQ5 0 | LDQ5 1 | LDQ5 2 | LDQ5 3 | LDQ5 4 | LDQ5 5 | LDQ5 6 | LDQ5 7 |
| LDQ6 0 | LDQ6 1 | LDQ6 2 | LDQ6 3 | LDQ6 4 | LDQ6 5 | LDQ6 6 | LDQ6 7 |
| LDQ7 0 | LDQ7 1 | LDQ7 2 | LDQ7 3 | LDQ7 4 | LDQ7 5 | LDQ7 6 | LDQ7 7 |
| UDQ0 0 | UDQ0 1 | UDQ0 2 | UDQ0 3 | UDQ0 4 | UDQ0 5 | UDQ0 6 | UDQ0 7 |
| UDQ1 0 | UDQ1 1 | UDQ1 2 | UDQ1 3 | UDQ1 4 | UDQ1 5 | UDQ1 6 | UDQ1 7 |
| UDQ2 0 | UDQ2 1 | UDQ2 2 | UDQ2 3 | UDQ2 4 | UDQ2 5 | UDQ2 6 | UDQ2 7 |
| UDQ3 0 | UDQ3 1 | UDQ3 2 | UDQ3 3 | UDQ3 4 | UDQ3 5 | UDQ3 6 | UDQ3 7 |
| UDQ4 0 | UDQ4 1 | UDQ4 2 | UDQ4 3 | UDQ4 4 | UDQ5 3 | UDQ4 6 | UDQ4 7 |
| UDQ5 0 | UDQ5 1 | UDQ5 2 | UDQ5 3 | UDQ4 4 | UDQ5 5 | UDQ5 6 | UDQ5 7 |
| UDQ6 0 | UDQ6 1 | UDQ6 2 | UDQ6 3 | UDQ6 4 | UDQ6 5 | UDQ6 6 | UDQ6 7 |
| UDQ7 0 | UDQ7 1 | UDQ7 2 | UDQ7 3 | UDQ7 4 | UDQ7 5 | UDQ7 6 | UDQ7 7 |
| PARITY DQ0 0 | PARITY DQ0 1 | PARITY DQ0 2 | PARITY DQ0 3 | PARITY DQ0 4 | PARITY DQ0 5 | PARITY DQ0 6 | PARITY DQ0 7 |

FIG. 16

ADDRESS MAPPING:OFFSET ADDRESS={ROW, BANK, BANK GROUP, COLUMN, WIDTH}

| ROW | BANK | BANK GROUP | COLUMN | WIDTH |
|---|---|---|---|---|

FIG. 17

INTERLEAVED MAPPING:OFFSET ADDRESS={ROW, BANK, COLUMN, BANK GROUP, WIDTH}

| ROW | BANK | COLUMN | BANK GROUP | WIDTH |
|---|---|---|---|---|

METHOD OF OPERATING MEMORY DEVICE AND METHODS OF WRITING AND READING DATA IN MEMORY DEVICE

CROSS-REFERENCE TO RELATED APPLICATION

This application claims priority under 35 USC §119 to Korean Patent Application No. 10-2013-0106808, filed on Sep. 5, 2013, in the Korean Intellectual Property Office (KIPO), the contents of which are herein incorporated by reference in their entirety.

BACKGROUND

1. Technical Field

Example embodiments relate generally to a memory device and more particularly to a method of operating memory device and methods of writing and reading data in a memory device.

2. Description of the Related Art

An error checking and correction (ECC) circuit may be used to check and correct errors of data stored in a memory device. Certain ECC circuits check the errors of stored data based on the stored data and parity data bits and correct the existing errors of the stored data.

As the amount of the data stored in the memory device is increased, the number of the required parity data bits to correct the errors increases. The increase of the parity data bits may cause an increase in the size of the memory device because the occupation area of a parity bit region in which the parity data bits are stored is considerable in the memory device.

SUMMARY

Some example embodiments provide a method of operating a memory device capable of decreasing a parity bit region in the memory device.

Some example embodiments provide methods of writing and reading data in a memory device capable of decreasing a parity bit region in the memory device.

In a method of operating memory device according to example embodiments, a command and a first address transferred from a memory controller are received. A read code word including a first set of data corresponding to the first address, a second set of data corresponding to a second address, and a read parity data is read from a memory cell array inside a memory device. Corrected data are generated by operating error checking and correction ECC using an ECC circuit based on the read cord word.

The second address may be internally determined in the memory device based on the first address, and has a different bank address, row address or column address from the first address.

The size of the second set of data may be equal to or greater than the size of the first set of data.

The size of the read code word may be fixed when an operation mode of the memory device is changed.

A write parity data may be generated by encoding a write data and a corrected second set of data included in the corrected data and a write code word including the write data, the corrected second set of data and the write parity data may be written in the memory cell array when the memory device operates in a write mode.

A corrected first data included in the corrected data may be read when the memory device operates in a read mode.

In a method of performing a write operation for a memory device according to example embodiments, a write command, a write address and a write data transferred from a memory controller are received. A read code word including a selection data corresponding to the write address, a non-selection data corresponding to a non-selection address generated based on the write address, and a read parity data is read from a memory cell array inside the memory device. Corrected data including a corrected selection data and a corrected non-selection data is generated by performing error checking and correction ECC for the selection data and the non-selection data based on the read parity data using an ECC circuit inside the memory device. A write parity data is generated by encoding the write data and the corrected non-selection data. A write code word including the write data, the corrected non-selection data and the write parity data is written in the memory cell array.

The write code word may be generated by replacing a portion corresponding to the corrected selection data included in the corrected data with the write data.

A time interval between read signals in a case where the memory device sequentially performs read operations may be shorter than a time interval between write signals in a case where the memory device sequentially performs write operations.

The write code word may be written in a plurality of bank groups included in the memory device by an interleaving scheme.

tCCD_L<tCCD_S*NBG may be satisfied when the memory device performs a write operation. (tCCD_L is a time interval between write commands in a case where the memory device sequentially performs write operations in the same memory bank group, tCCD_S is a time interval between the write signals in a case where the memory device sequentially performs write operations in a plurality of bank groups by the interleaving scheme, and NBG is the number of the bank groups.)

A bank group address of the memory device may be assigned to lower bits of the write address than a column address in address mapping.

According to example embodiments, a method of operating a memory device including a memory cell array divided into a data bit region and a parity bit region is provided. The method includes reading a first set of data from a selected data bit region corresponding to a first address received from a memory controller, a second set of data from a non-selected data bit region corresponding to a second address different from the first address, and a read parity data from the parity bit region; and generating corrected data by performing an operation of error checking and correction (ECC) using an ECC circuit based on the read parity data and the first and second sets of data.

The corrected selection data may be data that is error-corrected from the selection data corresponding to the first address.

BRIEF DESCRIPTION OF THE DRAWINGS

Illustrative, non-limiting example embodiments will be more clearly understood from the following detailed description taken in conjunction with the accompanying drawings.

FIG. 4 is a diagram for describing an ECC operation for the method of FIG. 3 according to an example embodiment.

FIG. 10 is a diagram for describing the ECC operation for the method of FIG. 9 according to an example embodiment.

FIG. 16 is a diagram illustrating an example memory mapping for the interleaving scheme of FIG. 15.

FIG. 17 is a diagram illustrating another example memory mapping for the interleaving scheme of FIG. 15.

DETAILED DESCRIPTION OF THE EMBODIMENTS

Figure 1:
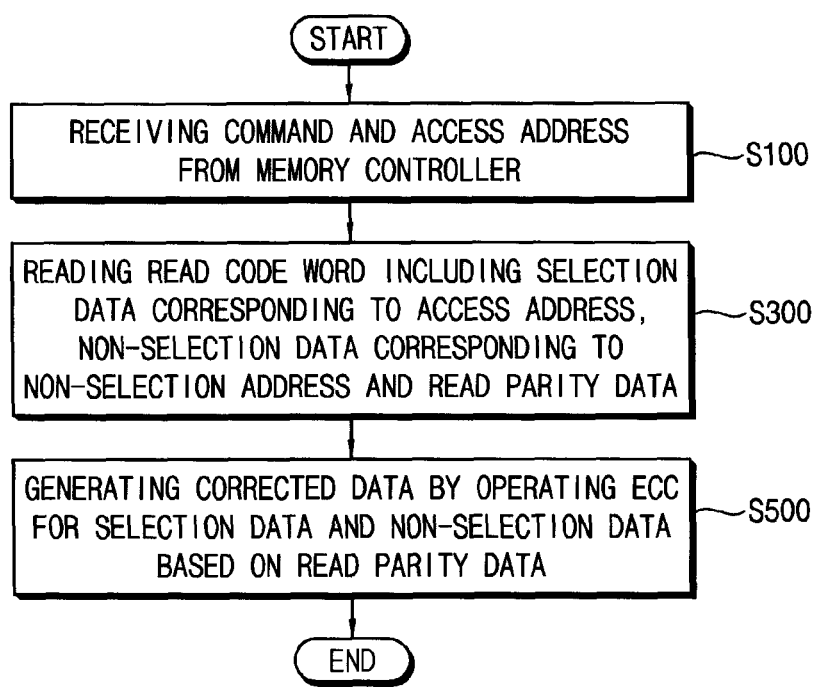
FIG. 1 is a flow chart illustrating a method of operating a memory device according to example embodiments.

Various example embodiments will be described more fully hereinafter with reference to the accompanying drawings, in which some example embodiments are shown. The present disclosure may, however, be embodied in many different forms and should not be construed as limited to the example embodiments set forth herein. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. Unless indicated otherwise, these terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present disclosure. As used herein, the singular forms "a," "an" and "the" are intended to include the plural forms as well, unless the context clearly indicates otherwise. It will be further understood that the terms such as "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
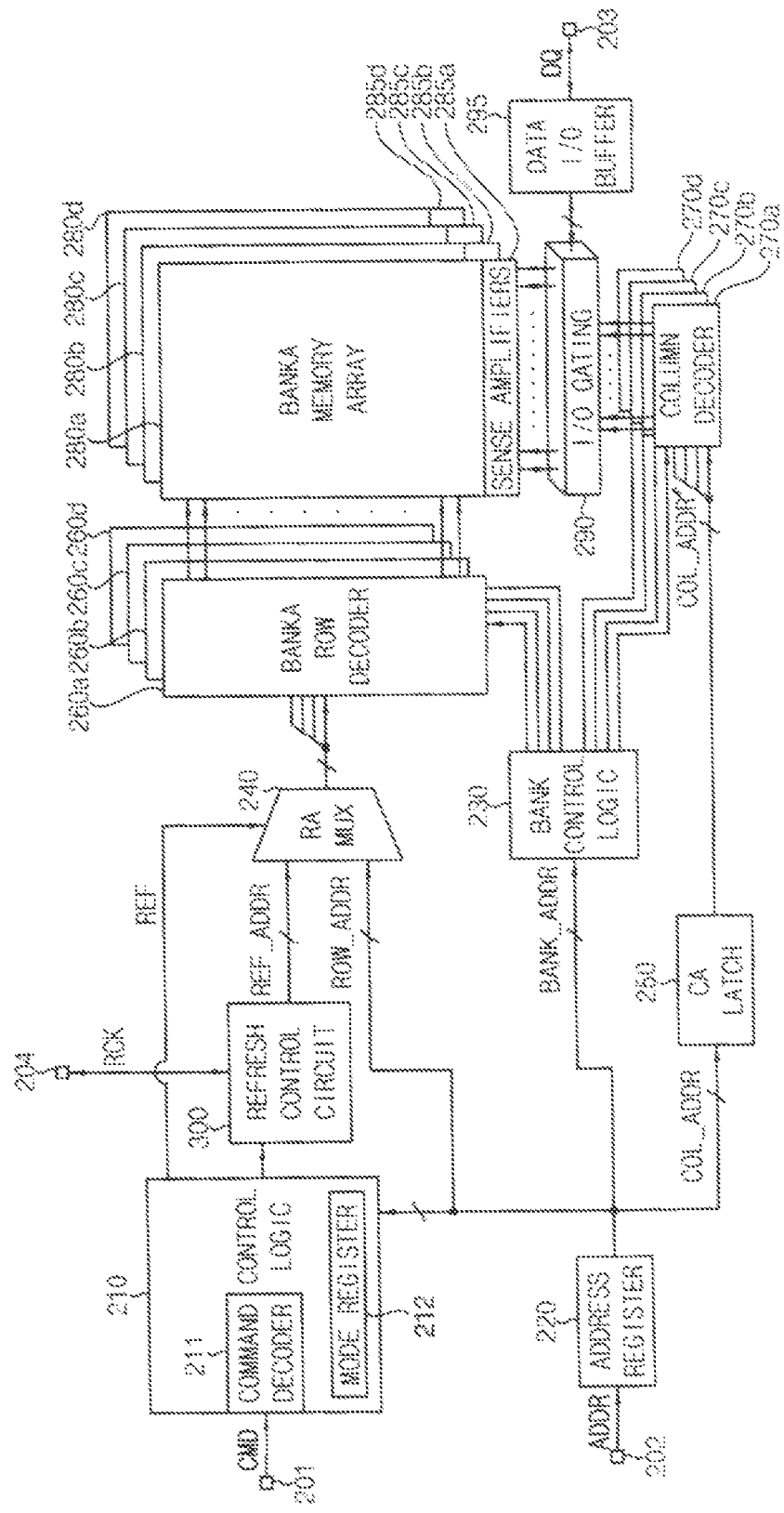
FIG. 2 is a block diagram illustrating a memory device according to an example embodiment.

FIG. 1 is a flow chart illustrating a method of operating a memory device according to example embodiments and FIG. 2 is a block diagram illustrating a memory device according to an example embodiment.

Referring to FIGS. 1 and 2, a memory device 200 receives a command CMD and an access address ADDR from a memory controller (not shown) (S100). For example, the command CMD received from the memory controller may be a write command (WR) and a read command (RD).

As will be described with reference to FIG. 3, a read code word (R_CW) including a selection data (SD) corresponding to the access address ADDR, a non-selection data (NSD) corresponding to a non-selection address (NS_ADDR) and a read parity data (R_PD) is read from a memory cell array 100 included in the memory device 200 (S300). For example, the access address ADDR may be received from the memory controller and the non-selection address (NS_ADDR) may be determined by a method that is pre-programmed in the memory device 200. The memory cell array 100 may include a data bit region and a parity bit region for storing data and parity data, respectively.

In one embodiment, corrected data are generated by performing an error checking and correction (ECC) for the selection data (SD) and the non-selection data (NSD) based on the read parity data (R_PD) using an ECC circuit in the memory device 200 (S500). For example, a hamming code may be used for the ECC operation for the selection data (SD) and the non-selection data (NSD). In a case where the ECC is performed using the hamming code, for example, the number of the parity bits may be 5 bits if the number of the data bits is 16 bits, the number of the parity bits may be 6 bits if the number of the data bits is 32 bits or the number of the parity bits may be 7 bits if the number of the data bits is 64 bits.

The method of operating a memory device according to example embodiments may read a read code word (R_CW) including a selection data (SD) corresponding to the access address ADDR from the memory controller, a non-selection data (NSD) corresponding to a non-selection address (NS_ADDR) generated in the memory device based on the access address ADDR, and a read parity data (R_PD). The method of operating memory device 200 may perform the ECC by reading the read code word (R_CW), of which the size is pre-determined, from a memory cell array 100 regardless of the operation mode. As a result, the parity bit region may be assigned in the memory cell array 100 regardless of the operation mode. Therefore the overhead such that the parity bit region occupies the memory cell array 100 may be decreased and the memory cell array 100 may be used efficiently.

Referring to FIG. 2, the memory device 200 includes a control logic 210, an address register 220, a bank control logic 230, a row address multiplexer 240, a column address latch 250, a row decoder, a column decoder, a memory cell array, a sense amplifier circuit, an input/output gating circuit 290, a data input/output buffer 295 and a refresh control circuit 300.

The memory cell array may include first through fourth bank arrays 280a, 280b, 280c and 280d. The row decoder may include first through fourth bank row decoders 260a, 260b, 260c and 260d respectively coupled to the first through fourth bank arrays 280a, 280b, 280c and 280d. The column decoder may include first through fourth bank column decoders 270a, 270b, 270c and 270d respectively coupled to the first through fourth bank arrays 280a, 280b, 280c and 280d. The sense amplifier circuit may include first through fourth bank sense amplifiers 285a, 285b, 285c and 285d respectively coupled to the first through fourth bank arrays 280a, 280b, 280c and 280d.

The first through fourth bank arrays 280a, 280b, 280c and 280d, the first through fourth bank row decoders 260a, 260b, 260c and 260d, the first through fourth bank column decoders 270a, 270b, 270c and 270d and the first through fourth bank sense amplifiers 285a, 285b, 285c and 285d may form first through fourth banks, respectively. Although the memory device 200 includes four banks, the memory device 200 may include any number of banks.

The control logic 210 may control operations of the memory device 200. For example, the control logic 210 may generate control signals for the memory device 200 to perform a write operation or a read operation. The control logic 210 may include a command decoder 211 that decodes the command signal CMD received from the memory controller through the command pin 201 and a mode register 212 that is used to set an operation mode of the memory device 200. For example, the command decoder 211 may generate the control signals corresponding to the command signal CMD by decoding a write enable signal (/WE), a row address strobe signal (/RAS), a column address strobe signal (/CAS), a chip select signal (/CS), etc. The control logic 210 may further receive a clock signal (CLK) and a clock enable signal (/CKE) for operating the memory device 200 in a synchronous manner.

The control logic 210 may control the refresh control circuit 300 such that the refresh control circuit 300 generates a refresh row address REF_ADDR on which a refresh operation is performed both in the power down mode and in the normal access mode. For example, the control logic 210 may control the refresh control circuit 300 such that the refresh control circuit 300 generates the refresh row address REF_ADDR regardless of the operation mode of the memory device. In addition, the control logic 210 may output an activated refresh signal REF while performing the refresh operation and output a deactivated refresh signal REF after finishing the refresh operation.

The refresh control circuit 300 included in the master memory device 200-1 may generate the refresh clock signal RCK, output the refresh clock signal RCK through the refresh pin 204, and generate the refresh row address REF_ADDR based on the refresh clock signal RCK.

The refresh control circuit 300 included in the slave memory device 200-2 may receive the refresh clock signal RCK through the refresh pin 204 and generate the refresh row address REF_ADDR based on the refresh clock signal RCK.

The address register 220 may receive the address signal ADDR including a bank address BANK_ADDR, a row address ROW_ADDR and a column address COL_ADDR from the memory controller through the address pin 202. The address register 220 may provide the bank address BANK_ADDR to the bank control logic 230, provide the row address ROW_ADDR to the row address multiplexer 240, and provide the column address COL_ADDR to the column address latch 250.

The bank control logic 230 may generate bank control signals in response to the bank address (BANK_ADDR). One of the first through fourth bank row decoders 260a, 260b, 260c and 260d corresponding to the bank address BANK_ADDR may be activated in response to the bank control signals, and one of the first through fourth bank column decoders 270a, 270b, 270c and 270d corresponding to the bank address BANK_ADDR may be activated in response to the bank control signals.

The row address multiplexer 240 may receive the row address ROW_ADDR from the address register 220 and receive the refresh row address REF_ADDR from the refresh control circuit 300. The row address multiplexer 240 may output one of the row address ROW_ADDR and the refresh row address REF_ADDR in response to the refresh signal REF received from the control logic 210. For example, the row address multiplexer 240 may output the refresh row address REF_ADDR when the refresh signal REF is activated, and output the row address ROW_ADDR when the refresh signal REF is deactivated. A row address output from the row address multiplexer 240 may be applied to the first through fourth bank row decoders 260a, 260b, 260c and 260d.

The activated one of the first through fourth bank row decoders 260a, 260b, 260c and 260d may decode the row address received from the row address multiplexer 240 and activate a word line corresponding to the row address. For example, the activated bank row decoder may apply a word line driving voltage to the word line corresponding to the row address.

The column address latch 250 may receive the column address COL_ADDR from the address register 220 and temporarily store the received column address COL_ADDR. In some embodiments, in a burst mode, the column address latch 250 may generate column addresses COL_ADDR' that increments from the received column address COL_ADDR.

The column address latch 250 may apply the temporarily stored or generated column address COL_ADDR' to the first through fourth bank column decoders 270a, 270b, 270c and 270d.

The activated one of the first through fourth bank column decoders 270a, 270b, 270c and 270d may decode the column address COL_ADDR received from the column address latch 250 and control the input/output gating circuit 290 to output data corresponding to the column address COL_ADDR.

The input/output gating circuit 290 may include a circuitry for gating input/output data. The input/output gating circuit 290 may further include an input data mask logic, read data latches for storing data received from the first through fourth bank arrays 280a, 280b, 280c and 280d, and write drivers for writing data to the first through fourth bank arrays 280a, 280b, 280c and 280d.

Data DQ to be read from one bank array of the first through fourth bank arrays 280a, 280b, 280c and 280d may be sensed by a sense amplifier coupled to the one bank array and stored in the read data latches. The data DQ stored in the read data latches may be provided to the memory controller via the data input/output buffer 295 and the data pin 203. Data DQ to be written to one bank array of the first through fourth bank arrays 280a, 280b, 280c and 280d may be provided from the memory controller to the data input/output buffer 295 via the data pin 203. The data DQ provided to the data input/output buffer 295 may be written to the one bank array via the write drivers.

In an example embodiment, the non-selection address (NS_ADDR) is internally determined in the memory device 200 by controlling at least one of a bank address (BANK_ADDR), a row address (ROW_ADDR) and a column address (COL_ADDR). For example, the non-selection address NS_ADDR may have a different bank address, row address or column address from the selection address ADDR.

For example, the read code word (R_CW) including the selection data (SD) corresponding to the access address ADDR and the non-selection data (NSD) corresponding to the non-selection address (NS_ADDR) may be read together. For example, to read the non-selection data (NSD), a method determining the non-selection data (NSD) that is not controlled by the memory controller may be needed.

For example, the non-selection data (NSD) may be obtained while the memory device 200 internally controls the bank address (BANK_ADDR). In a case where the access address ADDR is the address of the first bank, the non-selection address (NS_ADDR) may be the address of the second bank, the third bank or the fourth bank. For example, the non-selection data (NSD) may be obtained while the memory device 200 internally controls the row address (ROW_ADDR). In a case where the access address ADDR is the address of a first row, the non-selection address (NS_ADDR) may be the address of a second row, a third row or an n-th row (n is a positive integer). In another case where the access address ADDR is the address of a first row of a first block included in the first bank, the non-selection address (NS_ADDR) may be the address of a first row of a second block included in the first bank.

Figure 3:
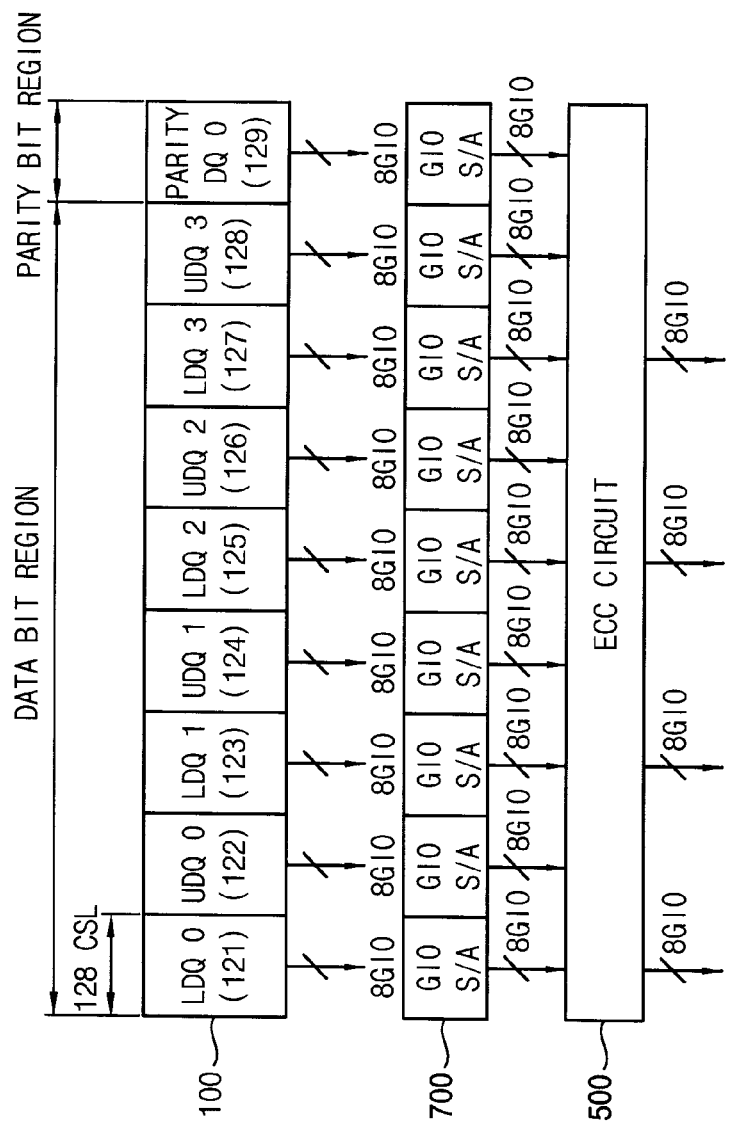
FIG. 3 is a diagram for describing a method of operating a memory device according to an example embodiment.

FIG. 3 is a diagram for describing a method of operating a memory device according to an example embodiment.

Referring to FIG. 3, the memory device 200 includes the memory cell array 100, a global I/O sense amplifier 700 and the error checking and correction circuit 500. The memory cell array 100 may output data based on a read command (RD) and an address received from the memory controller.

The global I/O sense amplifier 700 may amplify the data received from the memory cell array 100 to a CMOS level. The error checking and correction (ECC) circuit 500 may check and correct the data amplified to the CMOS level.

In one example, the selection data (SD) corresponding to the access address ADDR may be 8 bits inputted from a lower data region LDQ 0 to the error checking and correction circuit 500, 8 bits inputted from a lower data region LDQ 1 to the error checking and correction circuit 500, 8 bits inputted from a lower data region LDQ 2 to the error checking and correction circuit 500 and 8 bits inputted from a lower data region LDQ 3 to the error checking and correction circuit 500. Therefore the selection data (SD) may be a total of 32 bits with outputting 8 bits from each channel of 4 channels. For example, the memory device 200 may operate in ×4 mode.

The non-selection data (NSD) corresponding to the non-selection address (NS_ADDR) may be 8 bits inputted from a upper data region UDQ 0 to the error checking and correction circuit 500, 8 bits inputted from a upper data region UDQ 1 to the error checking and correction circuit 500, 8 bits inputted from a upper data region UDQ 2 to the error checking and correction circuit 500 and 8 bits inputted from a upper data region UDQ 3 to the error checking and correction circuit 500. Therefore the non-selection data (NSD) may be a total of 32 bits with outputting 8 bits from each channel of 4 channels.

The read parity data (R_PD) may be 8 bits inputted from a parity bit region parity DQ 0 to the error checking and correction circuit 500.

The read code word (R_CW) may include the 32 bits inputted from lower data regions LDQ 0 through LDQ3 to the error checking and correction circuit 500 that is the selection data (SD) corresponding to the access address ADDR, the 32 bits inputted from upper data regions UDQ 0 through UDQ 3 to the error checking and correction circuit 500 that is the non-selection data (NSD) corresponding to the non-selection address (NS_ADDR) and the 8 bits inputted from a parity bit region parity DQ 0 to the error checking and correction circuit 500. For example, the read code word (R_CW) may be a total of 72 bits. Accordingly, corrected data of the selection data (SD) and non-selection data (NSD) are generated in the error checking and correction circuit 500.

In FIG. 3, the method of operating memory device 200 describes the case in which the selection data (SD) is selected from the lower data regions. However, the selection data (SD) may be selected from the upper data regions.

In one embodiment, the method of operating the memory device 200 according to example embodiments performs the ECC by reading the read code word (R_CW), of which the size is pre-determined, from a memory cell array 100 of the memory device 200 regardless of the operation mode. For example, in a case where the memory device 200 operates in ×4, ×8 or chop mode, the pre-determined size of the data may be read regardless of the operation mode of the memory device 200. In FIG. 3, the size of the read code word (R_CW) is 72 bits. As a result, the parity bit region may be assigned in the memory cell array 100 regardless of the operation mode. Therefore the overhead such that the parity bit region occupies the memory cell array 100 may be decreased and the memory cell array 100 may be used efficiently. Though not shown, in one embodiment, the ECC circuit 500 includes circuitry to select the corrected selection data (SD) from the corrected data based on the access address ADDR.

In an example embodiment, the size of the non-selection data (NSD) may be variable according to an operation mode of the memory device 200.

In an example embodiment, the size of the read code word (R_CW) may be fixed though an operation mode of the memory device 200 is changed.

The method of operating memory device 200 according to example embodiments may read the read code word (R_CW), of which the size is pre-determined, from a memory cell array 100 regardless of the operation mode. For example, the read code word (R_CW) may include a selection data (SD) corresponding to the access address ADDR received from the memory controller, a non-selection data (NSD) corresponding to a non-selection address (NS_ADDR) and a read parity data (R_PD). For example, if the size of the selection data (SD) is changed, the size of the non-selection data (NSD) may be changed because the size of the read code word (R_CW) is pre-determined. The size of the selection data (SD) may be changed according to the operation mode of the memory device 200. If the size of the selection data (SD) is changed, the size of the non-selection data (NSD) may be changed. Therefore the size of the non-selection data (NSD) may be changed according to the operation mode of the memory device 200.

FIG. 4 is a diagram for describing an ECC operation for the method of FIG. 3 according to an example embodiment.

Referring to FIGS. 3 and 4, data illustrated from a first row to a ninth row may be the read code word (R_CW) that is read from the memory cell array 100 of FIG. 3. The data of the first row may be 8 bits inputted from the lower data region LDQ 0 to the error checking and correction circuit 500. The data of the second row may be 8 bits inputted from the lower data region LDQ 1 to the error checking and correction circuit 500. The data of the third row may be 8 bits inputted from the lower data region LDQ 2 to the error checking and correction circuit 500. The data of the fourth row may be 8 bits inputted from the lower data region LDQ 3 to the error checking and correction circuit 500. The data of the fifth row may be 8 bits inputted from the upper data region UDQ 0 to the error checking and correction circuit 500. The data of the sixth row may be 8 bits inputted from the upper data region UDQ 1 to the error checking and correction circuit 500. The data of the seventh row may be 8 bits inputted from the upper data region UDQ 2 to the error checking and correction circuit 500. The data of the eighth row may be 8 bits inputted from the upper data region UDQ 3 to the error checking and correction circuit 500. The data of the ninth row may be 8 bits inputted from the parity bit region parity DQ 0 to the error checking and correction circuit 500.

Using the 8 bits of the ninth row that are inputted from the parity bit region parity DQ 0 to the error checking and correction circuit 500, the corrected data may be generated by performing the error check and correction for the total of 72 bits inputted to the error checking and correction circuit 500. For example, in a case where the ECC is performed using the hamming code, 7 parity bits are needed to check and correct 64 bits of data.

Figure 5:
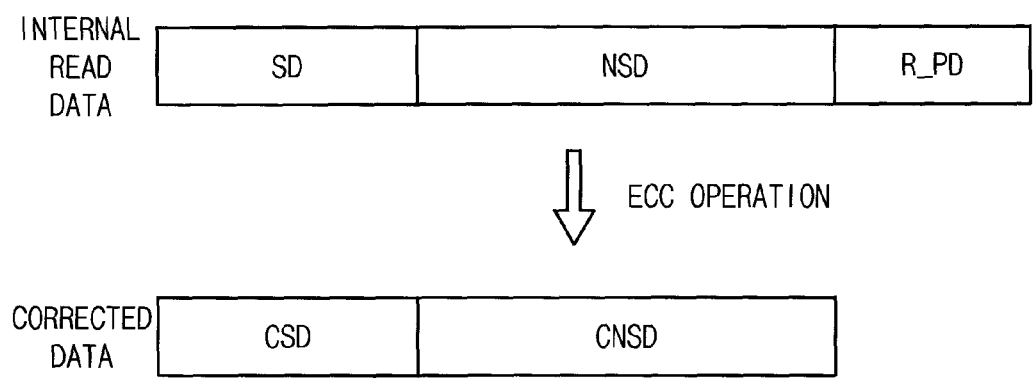
FIG. 5 is a diagram illustrating an ECC operation included in the method of FIG. 1 according to an example embodiment.

FIG. 5 is a diagram illustrating an ECC operation included in the method of FIG. 1 according to an example embodiment.

Referring to FIG. 5, a read code word (R_CW) including a selection data (SD) corresponding to the access address ADDR, a non-selection data (NSD) corresponding to a non-selection address (NS_ADDR) and a read parity data (R_PD) may be read from a memory cell array 100 in a memory device 200. In one embodiment, corrected data may be generated by performing the ECC for the selection data (SD) and the non-selection data (NSD) based on the read parity data (R_PD) using an ECC circuit. The corrected data may include a corrected selection data (CSD) and a corrected non-selection data (CNSD). For example, the corrected selection data (CSD) included in the corrected data may be outputted in a case where the memory device 200 operates in the read mode.

In an example embodiment, a write parity data (W_PD) may be generated by encoding a write data (WD) received from a memory controller and a corrected non-selection data (CNSD) included in the corrected data and a write code word (W_CW) including the write data (WD), the corrected non-selection data (CNSD) and the write parity data (W_PD) may be written in the memory cell array 100 in a case where the memory device 200 operates in a write mode.

In one embodiment, in a case where the memory device 200 operates in the write mode, the read code word (R_CW) including the selection data (SD), the non-selection data (NSD) and the read parity data (R_PD) may be read from the memory cell array 100 in the memory device 200. The corrected data may be generated by performing the ECC for the selection data (SD) and the non-selection data (NSD) based on the read parity data (R_PD) using an ECC circuit. The corrected data may include the corrected selection data (CSD) and the corrected non-selection data (CNSD). In the write mode, the address of the memory device to be written may be the access address ADDR. The data corresponding to the access address ADDR may be the selection data (SD). After the ECC for the selection data (SD), the corrected selection data (CSD) may be generated.

In one embodiment, the write parity data (W_PD) may be generated by encoding the write data (WD) and the corrected non-selection data (CNSD). The write code word (W_CW) including the write data (WD), the corrected non-selection data (CNSD) and the write parity data (W_PD) may be written in the memory cell array 100 of the memory device 200. The write data (WD) included in the write code word (W_CW) may be written in the portion corresponding to the access address ADDR of the memory device 200.

In an example embodiment, a corrected selection data (CSD) included in the corrected data may be read in a case where the memory device 200 operates in a read mode.

Figure 6:
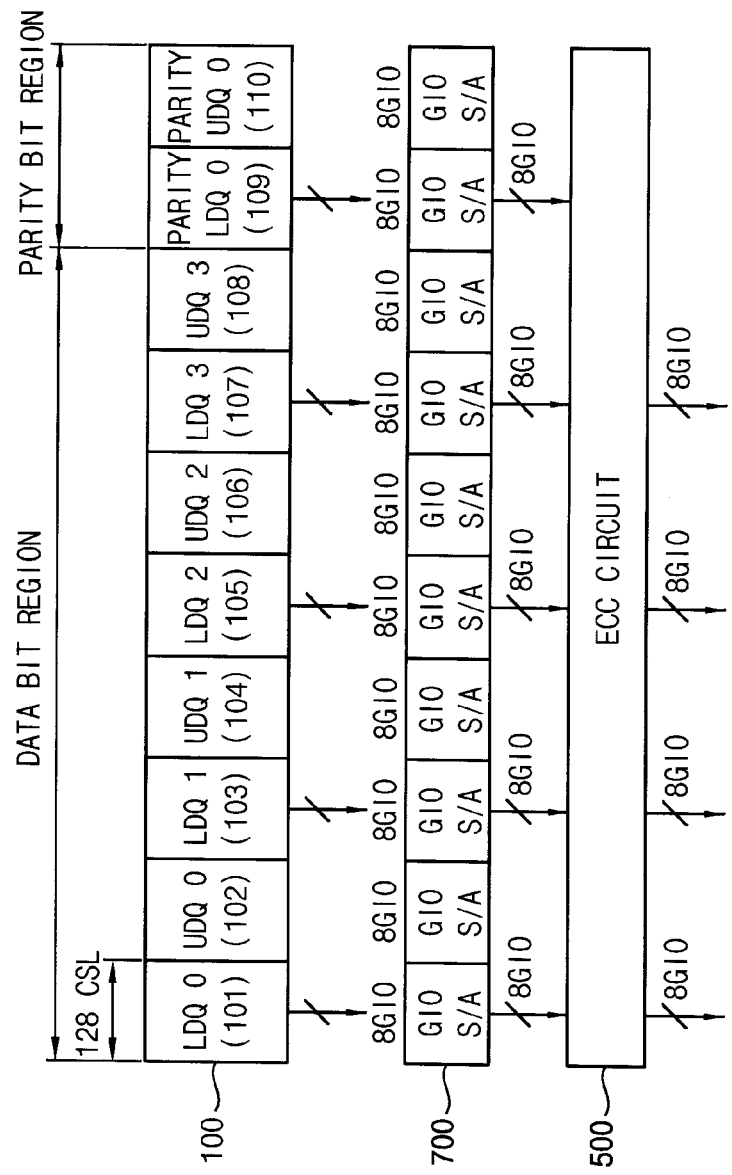
FIG. 6 is a diagram for describing an example of a method of operating a memory device.

FIG. 6 is a diagram for describing an example of a method of operating a memory device.

Referring to FIG. 6, the memory device 200 includes the memory cell array 100, the global I/O sense amplifier 700 and the error checking and correction circuit 500. The memory cell array 100 may output the data based on the read command (RD) and an address received from the memory controller. The global I/O sense amplifier 700 may amplify the data received from the memory cell array 100 to a CMOS level. The error checking and correction circuit 500 may check and correct the data amplified to the CMOS level.

The read code word (R_CW) may include the 32 bits inputted from lower data region LDQ 0 through LDQ 3 to the error checking and correction circuit 500 that is the selection data (SD) corresponding to the access address ADDR and the 8 bits inputted from a parity bit region parity LDQ 0 to the error checking and correction circuit 500. Accordingly, the read code word (R_CW) may be a total of 40 bits.

The global I/O sense amplifier 700 may amplify the selection data (SD) corresponding to the access address ADDR and output the amplified selection data (SD) to the error checking and correction circuit 500.

In a case where the example of FIG. 6 is used, the size of the read code word (R_CW) may be changed according to the operation mode of the memory device 200. Therefore the parity bit region may be implemented with considering the operation mode. As such, the parity bit region with considering the operation mode may be overhead in the chip size of the memory device 200.

However, the method of operating memory device 200 according to example embodiments may perform the ECC by reading the read code word (R_CW), of which the size is pre-determined, from a memory cell array 100 regardless of the operation mode. For example, in case the memory device 200 operates in ×4, ×8 or chop mode, the pre-determined size of the data may be read regardless of the operation mode of the memory device 200. In FIG. 3, the size of the read code word (R_CW) may be 72 bits. The parity cell region may be assigned in the memory cell array 100 regardless of the operation mode. Therefore the overhead such that the parity cell region occupies the memory cell array 100 may be decreased and the memory cell array 100 may be used efficiently.

Figure 7:
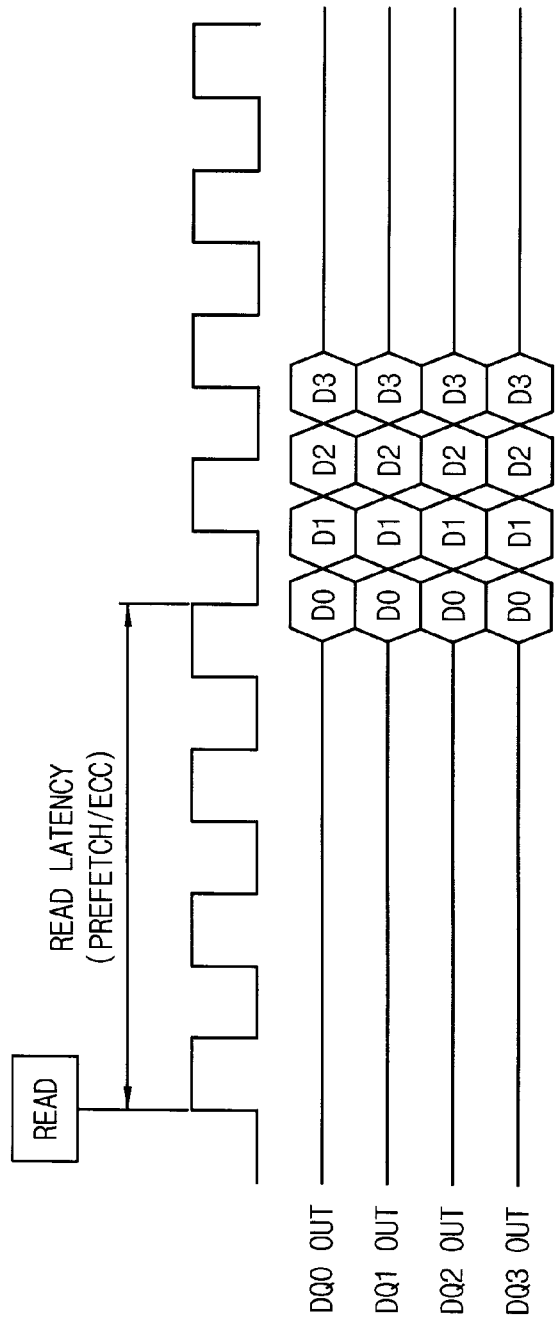
FIG. 7 is a timing diagram for describing an exemplary chop mode of operation modes of the memory device.
Figure 8:
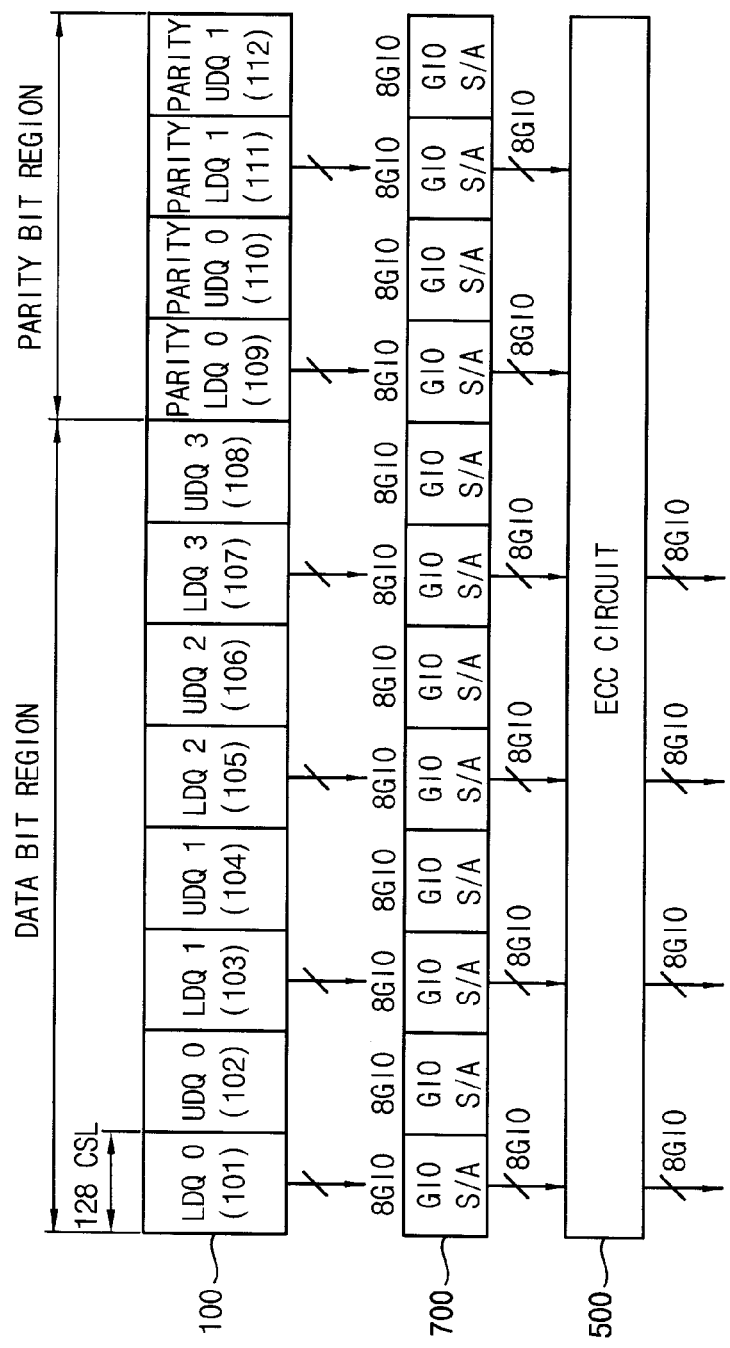
FIG. 8 is a diagram for describing an exemplary operation of an ECC circuit when the memory device operates in the chop mode.

FIG. 7 is a timing diagram for describing a chop mode of operation modes of the memory device and FIG. 8 is a diagram for describing an operation of an ECC circuit when the memory device operates in the chop mode.

Referring FIGS. 7 and 8, the data outputted to each of the global I/O lines may be 8 bits. In the chop mode included in the operation modes of memory device 200, a part of the data outputted to each of the global I/O lines may be outputted. For example, the data bits outputted to each of the global I/O lines may be transferred via the DQ pad. The case of FIG. 7 may be an example of the chop mode operation. For example, 4 bits may be outputted via each of the DQ pads DQ0, DQ1, DQ2 and DQ3 if the read latency passes after the read command (RD).

As such, the parity bit region considering the operation mode may be overhead in the chip size of the memory device 200.

However, the method of operating memory device 200 may operate the ECC by reading the read code word (R_CW), of which the size is pre-determined, from a memory cell array 100 regardless of the operation mode. As a result, the parity cell region may be assigned in the memory cell array 100 regardless of the operation mode. Therefore the overhead such that the parity cell region occupies the memory cell array 100 may be decreased and the memory cell array 100 may be used efficiently.

Figure 9:
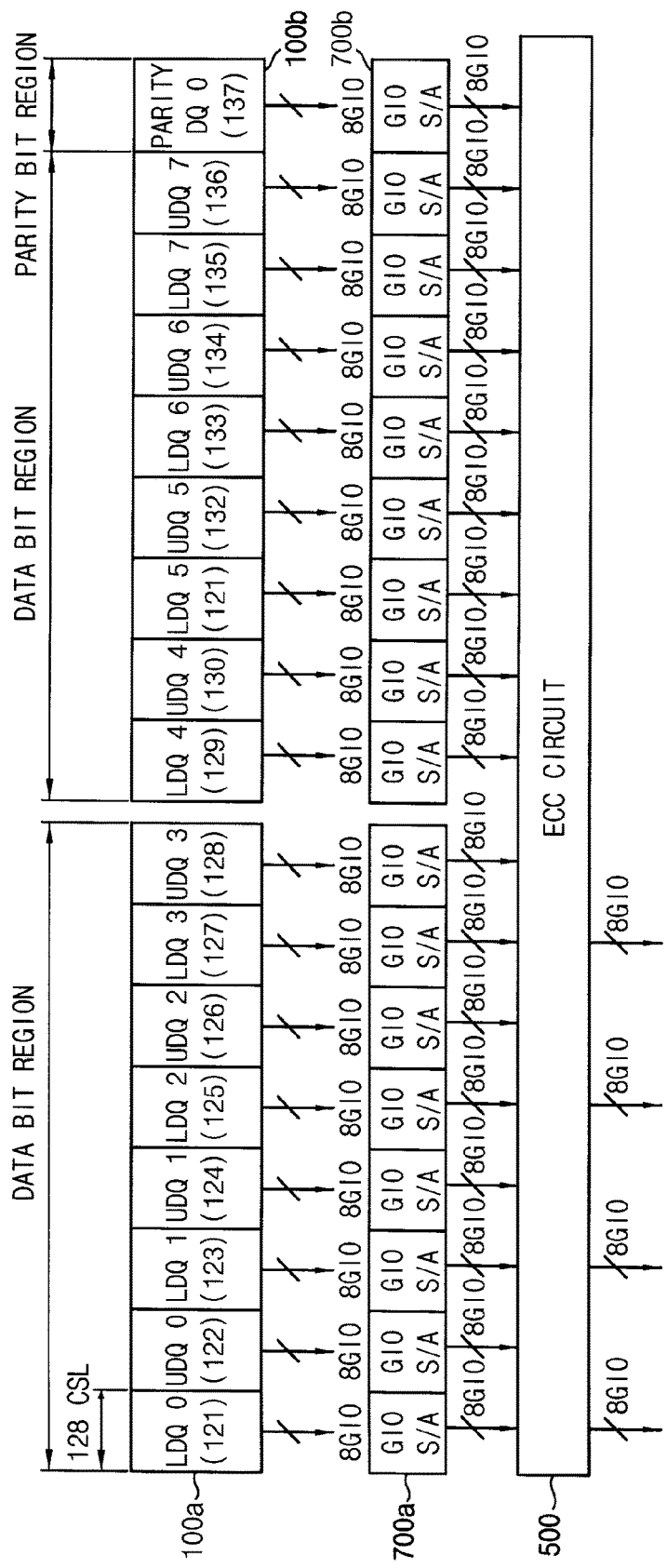
FIG. 9 is a block diagram for describing a method of operating a memory device according to another example embodiment.

FIG. 9 is a block diagram for describing a method of operating a memory device according to another example embodiment.

Referring to FIG. 9, the memory device 200 includes a memory cell array 100 (e.g., a first memory cell array 100a and a second memory cell array 100b), a first global I/O sense amplifier 700a, a second global I/O sense amplifier 700b and the error checking and correction circuit 500. For example, a selection data bit region of the first memory cell array 100a may output a first data based on a first command CMD and a first address received from the memory controller. A non-selection data bit region of the first memory cell array 100a and the second memory cell array 100b may output a second data based on the first command CMD and a second address received from the memory controller. The first global I/O sense amplifier 700a may amplify the first data received from the first memory cell array 100a to a CMOS level. The second global I/O sense amplifier 700b may amplify the second data received from the first and second memory cell arrays 100a and 100b to the CMOS level. The error checking and correction circuit 500 may check and correct the first data and the second data amplified to the CMOS level.

The selection data (SD) corresponding to the access address ADDR may be 8 bits inputted from a lower data region LDQ 0 to the error checking and correction circuit 500, 8 bits inputted from a lower data region LDQ 1 to the error checking and correction circuit 500, 8 bits inputted from a lower data region LDQ 2 to the error checking and correction circuit 500 and 8 bits inputted from a lower data region LDQ 3 to the error checking and correction circuit 500. Therefore the selection data (SD) may be a total of 32 bits with outputting 8 bits from each channel of 4 channels. For example, the memory device 200 may be operated in ×4 mode.

The non-selection data (NSD) corresponding to the non-selection address (NS_ADDR) may be 8 bits inputted from a upper data region UDQ 0 to the error checking and correction circuit 500, 8 bits inputted from a upper data region UDQ 1 to the error checking and correction circuit 500, 8 bits inputted from a upper data region UDQ 2 to the error checking and correction circuit 500, 8 bits inputted from a upper data region UDQ 3 to the error checking and correction circuit 500, 8 bits inputted from a lower data region LDQ 4 to the error checking and correction circuit 500, 8 bits inputted from a lower data region LDQ 5 to the error checking and correction circuit 500, 8 bits inputted from a lower data region LDQ 6 to the error checking and correction circuit 500, 8 bits inputted from a lower data region LDQ 7 to the error checking and correction circuit 500, 8 bits inputted from a upper data region UDQ 4 to the error checking and correction circuit 500, 8 bits inputted from a upper data region UDQ 5 to the error checking and correction circuit 500, 8 bits inputted from a upper data region UDQ 6 to the error checking and correction circuit 500 and 8 bits inputted from a upper data region UDQ 7 to the error checking and correction circuit 500. Therefore the non-selection data (NSD) may be a total of 96 bits with outputting 8 bits from each channel of 12 channels.

The read parity data (R_PD) may be 8 bits inputted from a parity bit region parity DQ 0 to the error checking and correction circuit 500.

The read code word (R_CW) may include the 32 bits inputted from lower data regions LDQ 0 through LDQ 3 to the error checking and correction circuit 500 that is the selection data (SD) corresponding to the access address ADDR, the 96 bits inputted from the upper data regions UDQ 0 through UDQ 7 and the lower data regions LDQ 4 through LDQ 7 to the error checking and correction circuit 500 that is the non-selection data (NSD) corresponding to the non-selection address (NS_ADDR), and the 8 bits inputted from a parity bit region parity DQ 0 to the error checking and correction circuit 500. For example, the read code word (R_CW) is a total of 136 bits. Accordingly, corrected data of the selection data (SD) and non-selection data (NSD) are generated in the error checking and correction circuit 500.

In one embodiment, the method of operating the memory device 200 according to example embodiments may perform the ECC by reading the read code word (R_CW), of which the size is pre-determined, from the memory cell array 100 regardless of the operation mode. For example, in a case where the memory device 200 operates in ×4, ×8 or chop mode, the pre-determined size of the data may be read regardless of the operation mode of the memory device 200. As a result, the parity bit region may be assigned in the memory cell array 100 regardless of the operation mode. Therefore the overhead such that the parity bit region occupies the memory cell array 100 may be decreased and the memory cell array 100 may be used efficiently. Though not shown, in one embodiment, the ECC circuit 500 includes circuitry to select the corrected selection data (SD) from the corrected data based on the access address ADDR.

FIG. 10 is a diagram for describing the ECC operation for the method of FIG. 9 according to an example embodiment.

Referring to FIGS. 9 and 10, data illustrated from a first row to a seventeenth row may be a read code word (R_CW) that is read from the memory cell array 100 of FIG. 9. The data of the first row may be 8 bits inputted from the lower data region LDQ 0 to the error checking and correction circuit 500. The data of the second row may be 8 bits inputted from the lower data region LDQ 1 to the error checking and correction circuit 500. The data of the third row may be 8 bits inputted from the lower data region LDQ 2 to the error checking and correction circuit 500. The data of the fourth row may be 8 bits inputted from the lower data region LDQ 3 to the error checking and correction circuit 500. The data of the fifth row may be 8 bits inputted from the lower data region LDQ 4 to the error checking and correction circuit 500. The data of the sixth row may be 8 bits inputted from the lower data region LDQ 5 to the error checking and correction circuit 500. The data of the seventh row may be 8 bits inputted from the lower data region LDQ 6 to the error checking and correction circuit 500. The data of the eighth row may be 8 bits inputted from the lower data region LDQ 7 to the error checking and correction circuit 500. The data of the ninth row may be 8 bits inputted from the upper data region UDQ 0 to the error checking and correction circuit 500. The data of the tenth row may be 8 bits inputted from the upper data region UDQ 1 to the error checking and correction circuit 500. The data of the eleventh row may be 8 bits inputted from the upper data region UDQ 2 to the error checking and correction circuit 500. The data of the twelfth row may be 8 bits inputted from the upper data region UDQ 3 to the error checking and correction circuit 500. The data of the thirteenth row may be 8 bits inputted from the upper data region UDQ 4 to the error checking and correction circuit 500. The data of the fourteenth row may be 8 bits inputted from the upper data region UDQ 5 to the error checking and correction circuit 500. The data of the fifteenth row may be 8 bits inputted from the upper data region UDQ 6 to the error checking and correction circuit 500. The data of the sixteenth row may be 8 bits inputted from the upper data region UDQ 7 to the error checking and correction circuit 500. The data of the seventeenth row may be 8 bits inputted from the parity bit region parity DQ 0 to the error checking and correction circuit 500.

Using the 8 bits of the seventeenth row that is inputted from the parity bit region parity DQ 0 to the error checking and correction circuit 500, the corrected data may be generated by performing the error check and correction for the total of 136 bits inputted to the error checking and correction circuit 500. For example, in case the ECC is performed using the hamming code, 8 parity bits are needed to check and correct 128 bits data.

Figure 11:
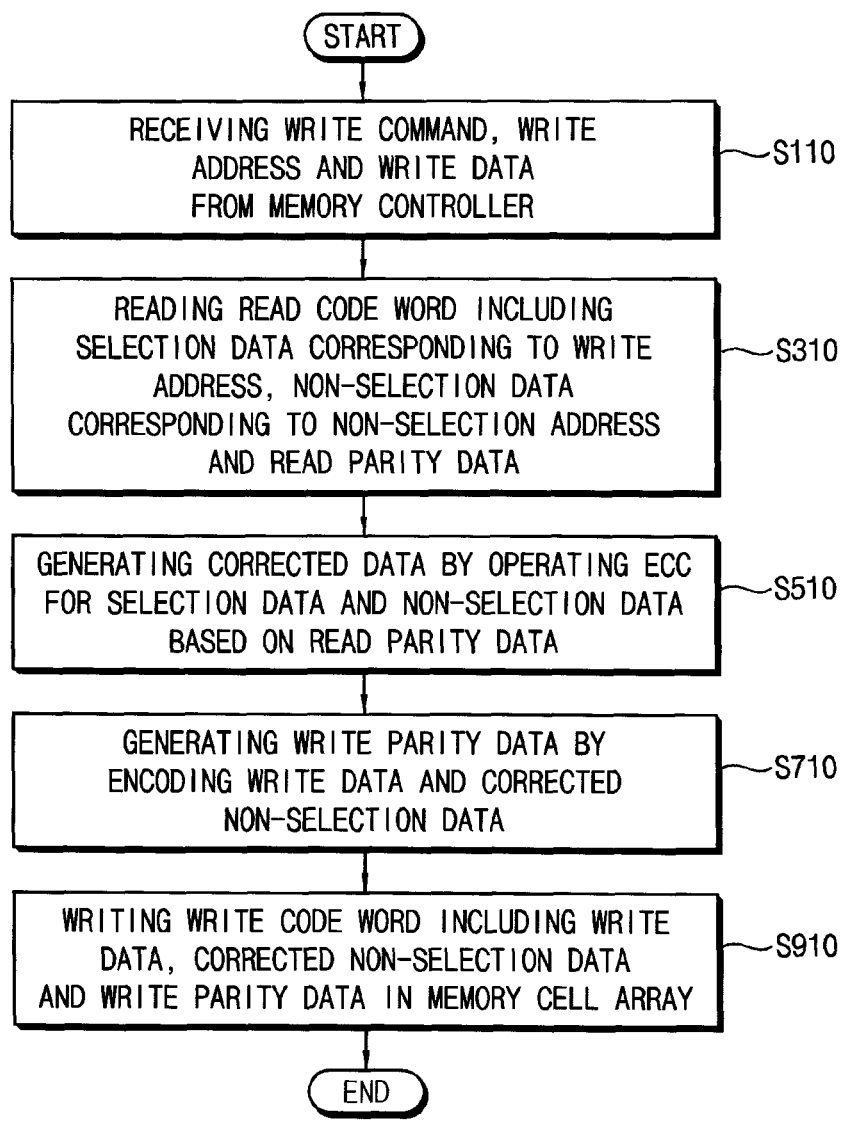
FIG. 11 is a flow chart illustrating a method of writing data in a memory device according to example embodiments.

FIG. 11 is a flow chart illustrating a method of writing data in a memory device according to example embodiments.

Referring to FIG. 11, in a method of writing data of the memory device 200, a write command CMD, a write address and a write data (WD) received from a memory controller are received (S110).

In one embodiment, a read code word (R_CW) including a selection data (SD) corresponding to the write address, a non-selection data (NSD) corresponding to a non-selection address (NS_ADDR) and a read parity data (R_PD) is read from a memory cell array 100 in the memory device 200 (S310). For example, the write address may be received from the memory controller and the non-selection address (NS_ADDR) may be determined by a method that is pre-programmed in the memory device 200.

In one embodiment, corrected data including a corrected selection data (CSD) and a corrected non-selection data (CNSD) is generated by performing the ECC for the selection data (SD) and the non-selection data (NSD) based on the read parity data (R_PD) using an ECC circuit (S510). For example, the hamming code may be used as the method of operating the ECC for the selection data (SD) and the non-selection data (NSD). In a case where the ECC is performed using the hamming code, for example, the number of the parity bits may be 5 bits if the number of the data bits is 16 bits, the number of the parity bits may be 6 bits if the number of the data bits is 32 bits or the number of the parity bits may be 7 bits if the number of the data bits is 64 bits.

A write parity data (W_PD) is generated by encoding the write data (WD) and the corrected non-selection data (CNSD) (S710). In the write mode, the address of the memory device to be written may be the write address. The data corresponding to the write address may be the selection data (SD). After the ECC for the selection data (SD), the corrected selection data (CSD) may be generated. Therefore the write data (WD) and the corrected non-selection data (CNSD) may be encoded by replacing the corrected selection data (CSD) with the write data (WD). The write parity data (W_PD) may be generated after encoding the write data (WD) and the corrected non-selection data (CNSD).

A write code word (W_CW) including the write data (WD), the corrected non-selection data (CNSD) and the write parity data (W_PD) is written in the memory cell array 100 (S910).

In one embodiment, the method of writing data in the memory device 200 according to example embodiments may perform the ECC by reading the read code word (R_CW), of which the size is pre-determined, from a memory cell array 100 regardless of the operation mode. For example, in a case where the memory device 200 operates in ×4, ×8 or chop mode, the pre-determined size of the data may be read regardless of the operation mode of the memory device 200. The parity bit region may be assigned in the memory cell array 100 regardless of the operation mode. Therefore the overhead such that the parity bit region occupies the memory cell array 100 may be decreased and the memory cell array 100 may be used efficiently.

In an example embodiment, the write code word (W_CW) may be generated by replacing a portion corresponding to the corrected selection data (CSD) included in the corrected data with the write data (WD). In the write mode, the address of the memory to be written may be the write address. The data corresponding to the write address may be the selection data (SD). After the ECC for the selection data (SD), the corrected selection data (CSD) may be generated. Therefore the corrected selection data (CSD) may be replaced with the write data (WD).

Figure 12:
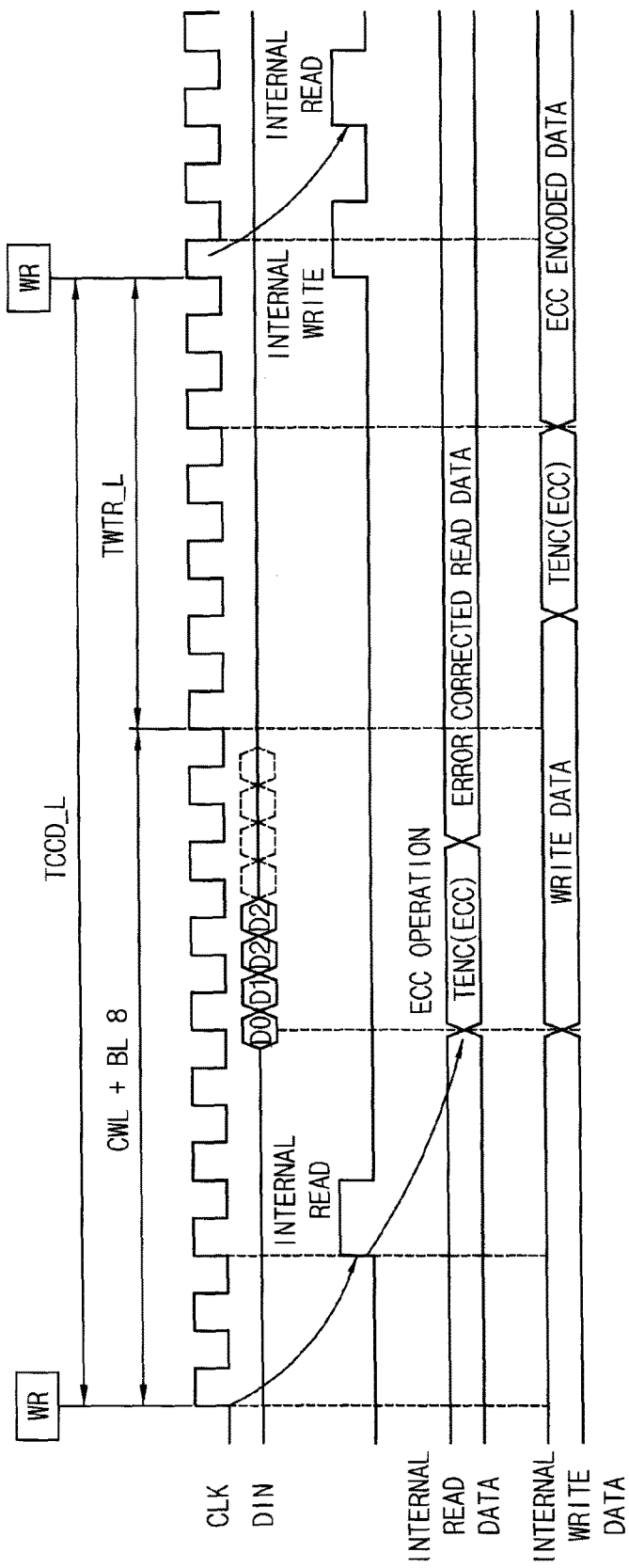
FIG. 12 is a timing diagram for describing the method of FIG. 11 according to an example embodiment.

FIG. 12 is a timing diagram for describing the method of FIG. 11 according to an example embodiment.

Referring to FIG. 12, if the memory device 200 receives the write command CMD in synchronization with the clock signal, the read code word (R_CW) including a selection data (SD) corresponding to the write address, a non-selection data (NSD) corresponding to a non-selection address (NS_ADDR) and a read parity data (R_PD) may be read from a memory cell array 100 in a memory device 200. The corrected data including a corrected selection data (CSD) and a corrected non-selection data (CNSD) are generated by performing the ECC for the selection data (SD) and the non-selection data (NSD) based on the read parity data (R_PD) using an ECC circuit. The corrected data may include the corrected selection data (CSD) and the corrected non-selection data (CNSD). The write parity data (W_PD) is generated by encoding the write data (WD) and the corrected non-selection data (CNSD). A write code word (W_CW) including the write data (WD), the corrected non-selection data (CNSD) and the write parity data (W_PD) may be written in the memory cell array 100.

Figure 13:
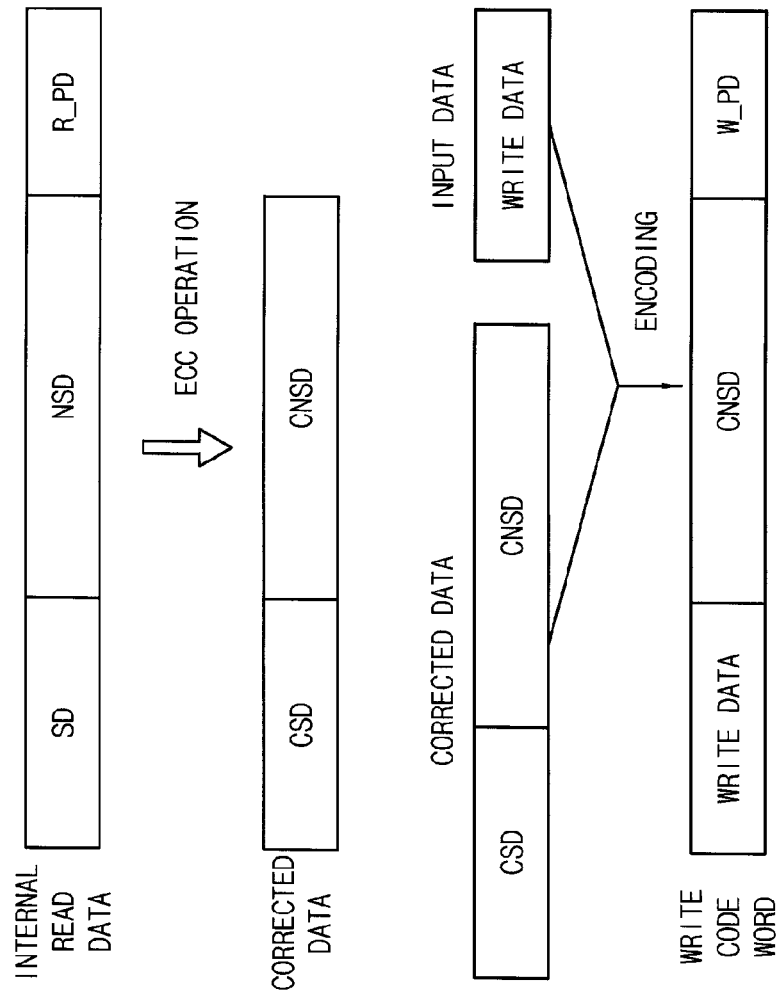
FIG. 13 is a diagram illustrating the ECC operation and an encoding operation included in the method of FIG. 11 according to an example embodiment.

FIG. 13 is a diagram illustrating the ECC operation and an encoding operation included in the method of FIG. 11 according to an example embodiment.

Referring to FIGS. 11 and 13, the read code word (R_CW) including a selection data (SD) corresponding to the write address, a non-selection data (NSD) corresponding to a non-selection address (NS_ADDR) and a read parity data (R_PD) may be read from a memory cell array 100 in a memory device 200. The corrected data including a corrected selection data (CSD) and a corrected non-selection data (CNSD) is generated by performing the ECC for the selection data (SD) and the non-selection data (NSD) based on the read parity data (R_PD) using an ECC circuit in the memory device 200. The corrected data may include the corrected selection data (CSD) and the corrected non-selection data (CNSD). In write mode of the memory device 200, the write data (WD) and the corrected non-selection data (CNSD) may be encoded by replacing the corrected selection data (CSD) with the write data (WD). If the write data (WD) and the corrected non-selection data (CNSD) are encoded, the write parity data (W_PD) may be generated.

In the method of writing data of memory device 200 according to example embodiments, the ECC may be internally performed for the read code word (R_CW) before the write operation. The reason why the ECC is internally performed for the read code word (R_CW) before the write operation is because the parity bit region is operated by the pre-determined size unit of the code word.

For example, in a case where the size of the write data (WD) is smaller than the size of the code word, the error may not be in the data corresponding to the read code word (R_CW) if the ECC is performed for the read code word (R_CW). As such, the encoding process may be performed by replacing the portion corresponding to the write address with the write data (WD). For example, the ECC may be performed for the portion corresponding to the non-selection data (NSD) included in the read code word (R_CW).

However, in a case where the write data (WD) is directly written in a memory cell array 100 corresponding to the write address, the write code word (W_CW) may be written in the memory cell array 100 without the ECC for the read code word (R_CW). In this case, if the error is in the portion corresponding to the non-selection data (NSD) included in the code word, the error may not be corrected any more.

In an example embodiment, a time interval between read signals (RD) in case the memory device 200 sequentially performs read operations may be shorter than a time interval between write signals (WR) in case the memory device 200 sequentially performs write operations.

In the read operation mode, the read code word (R_CW) including a selection data (SD) corresponding to the read address, a non-selection data (NSD) corresponding to a non-selection address (NS_ADDR) and a read parity data (R_PD) may be read from a memory cell array 100 in a memory device 200. The corrected data including a corrected selection data (CSD) and a corrected non-selection data (CNSD) may be generated by performing the ECC for the selection data (SD) and the non-selection data (NSD) based on the read parity data (R_PD) using an ECC circuit in the memory device 200. The corrected data may include the corrected selection data (CSD) and the corrected non-selection data (CNSD). In the read operation mode, the corrected selection data (CSD) included in the corrected data may be outputted.

In the write operation mode, the read code word (R_CW) including a selection data (SD) corresponding to the write address, a non-selection data (NSD) corresponding to a non-selection address (NS_ADDR) and a read parity data (R_PD) may be read from a memory cell array 100 in a memory device 200. The corrected data including a corrected selection data (CSD) and a corrected non-selection data (CNSD) may be generated by performing the ECC for the selection data (SD) and the non-selection data (NSD) based on the read parity data (R_PD) using an ECC circuit in the memory device 200. The corrected data may include the corrected selection data (CSD) and the corrected non-selection data (CNSD). In the write operation mode, the write parity data (W_PD) may be generated by encoding the write data (WD) and the corrected non-selection data (CNSD). A write code word (W_CW) including the write data (WD), the corrected non-selection data (CNSD) and the write parity data (W_PD) may be written in the memory cell array 100.

In case of the read mode and the write mode, the ECC may be internally performed by reading the read code word (R_CW). In case of the read mode, the read operation may be finished if the corrected selection data (CSD) is outputted after the ECC. However, in case of the write mode, the encoding process for the write data (WD) and the corrected non-selection data (CNSD) and the writing process in the memory cell array 100 may be needed. Therefore the time interval between read signals (RD) in case the memory device 200 sequentially performs read operations may be shorter than the time interval between write signals (WR) in case the memory device 200 sequentially performs write operations.

Figure 14:
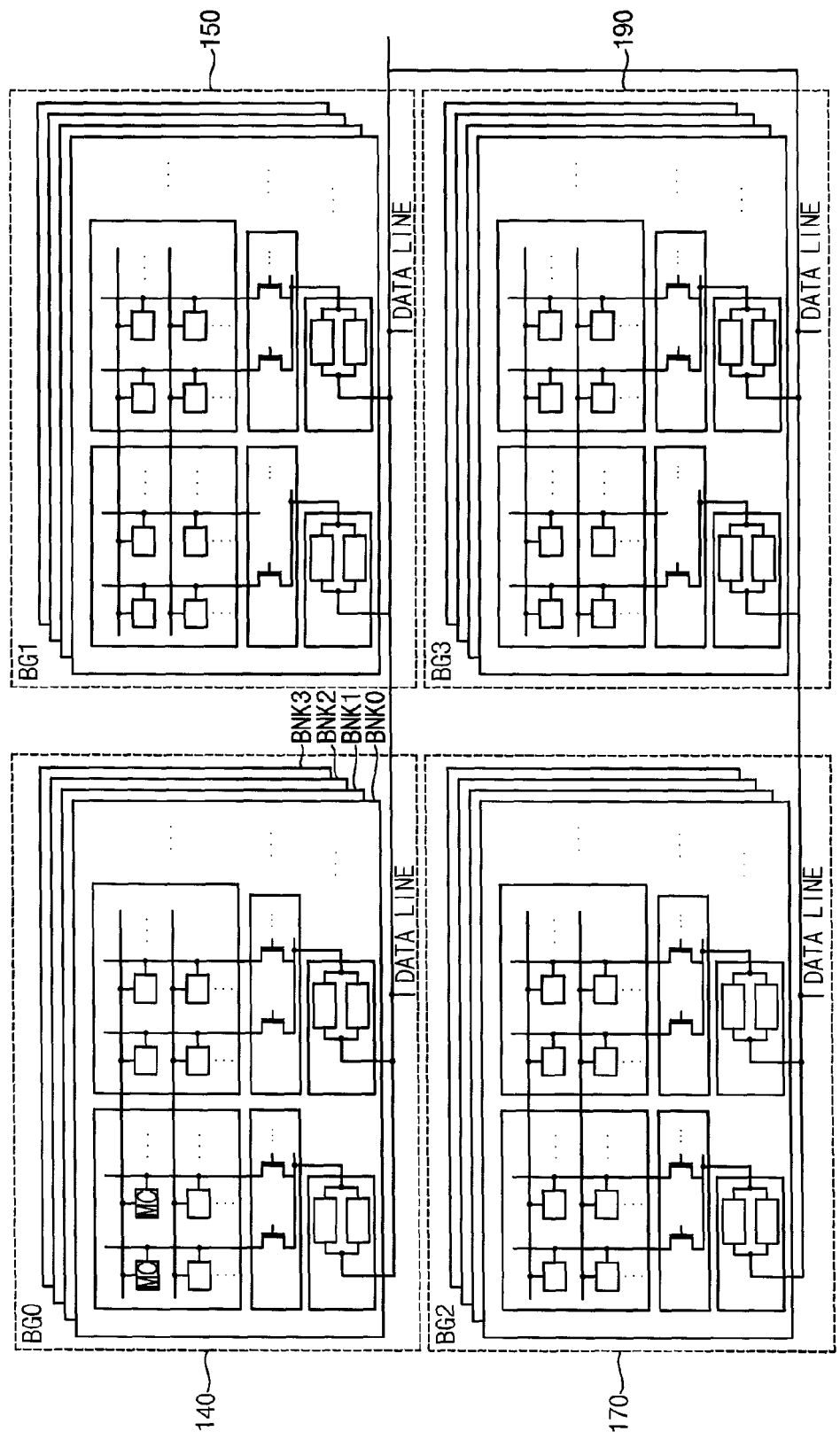
FIG. 14 is an exemplary block diagram for describing an interleaving scheme among bank groups in the memory device according to an example embodiment.

FIG. 14 is an exemplary block diagram for describing an interleaving scheme among bank groups in the memory device 200 according to an example embodiment.

Referring to FIG. 14, the write code word (W_CW) may be written in a plurality of bank groups 140, 150, 170 and 190 included in the memory device 200 by the interleaving scheme. In a case where the write code word (W_CW) is sequentially written in the memory cell array 100 included in the same bank group, to write a second data sequentially after a first data is written in the same bank group, the time interval may be needed to rearrange the I/O line. However, In a case where the write code word (W_CW) is sequentially written in the memory cell array 100 included in the different bank groups, to write a second data sequentially in other bank group after a first data is written in one bank group, the time interval may not be needed to rearrange the I/O line.

In a case where the memory device 200 sequentially performs write operations, for example, after the write operation is performed in a bank group 140, the write operation is performed in a bank group 150, the write operation is performed in a bank group 170, and then the write operation is performed in a bank group 190, sequentially. For example, the write operation by the interleaving scheme may be faster than the write operation in the same bank group.

Figure 15:
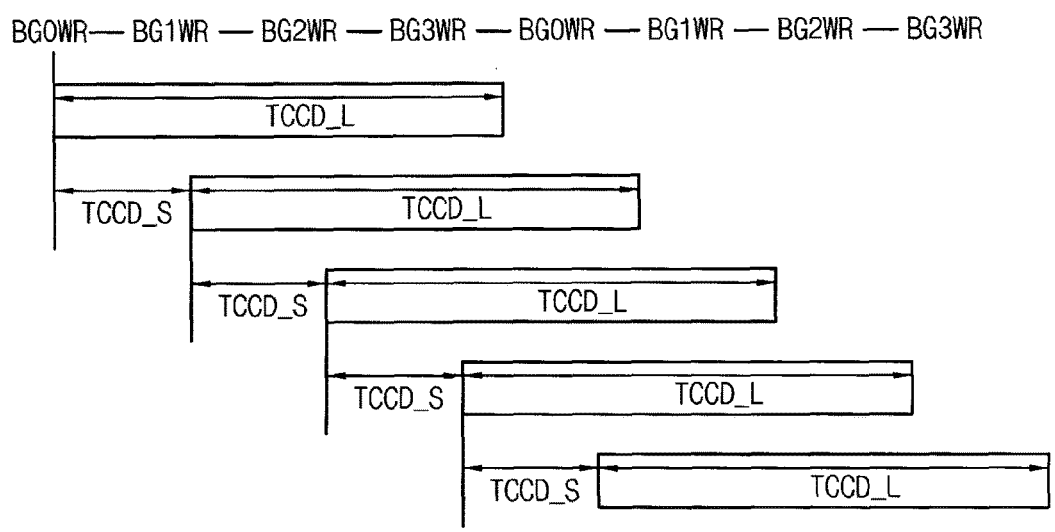
FIG. 15 is a timing diagram for describing the interleaving scheme among the bank groups in the memory device of FIG. 14.

FIG. 15 is a timing diagram for describing the interleaving scheme among the bank groups in the memory device 200 of FIG. 14.

Referring to FIGS. 14 and 15, tCCD_L<tCCD_S*NBG is satisfied in a case where the memory performs a write operation. (tCCD_L is a time interval between write commands (WR) in case the memory device 200 sequentially performs write operations in the same memory bank group, tCCD_S is a time interval between the write commands (WR) in a case where the memory device 200 sequentially performs write operations in a plurality of bank groups by the interleaving scheme and NBG is the number of the bank groups.)

In a case where tCCD_L<tCCD_S*NBG is not satisfied, the write data (WD) may not be written in the memory cell array 100 sequentially. In a case where the memory device 200 sequentially performs the write operations, for example, when the write operation in the bank group 140 is performed again after the write operation is performed in the bank group 140, the write operation is performed in the bank group 150, the write operation is performed in the bank group 170, and then the write operation is performed in the bank group 190, the I/O line may be rearranged. In the case where tCCD_L<tCCD_S*NBG is not satisfied, the write data (WD) may not be written in the memory cell array 100 sequentially because the I/O line transferring the write data (WD) is not rearranged.

FIG. 16 is a diagram illustrating an example memory mapping for the interleaving scheme of FIG. 15 and FIG. 17 is a diagram illustrating another example memory mapping for the interleaving scheme of FIG. 15.

Referring to FIG. 16, a bank group address (BG_ADDR) of the memory device 200 is assigned to a higher bit of the write address than a column address (COL_ADDR) in address mapping. In the write mode, the write data (WD) may be written in the memory cell array 100 with increasing the write address sequentially. In a case where the bank group address (BG_ADDR) is placed in a higher bit than the column address (COL_ADDR) in address mapping, the write operation may not performed in the plurality of the bank groups by the interleaving scheme as the write address is increased sequentially.

Referring to FIG. 17, in a case where the bank group address (BG_ADDR) is assigned to a lower bit of the write address than the column address (COL_ADDR) in address mapping, the write operation may performed in the plurality of the bank groups by the interleaving scheme as the write address is increased sequentially.

Figure 18:
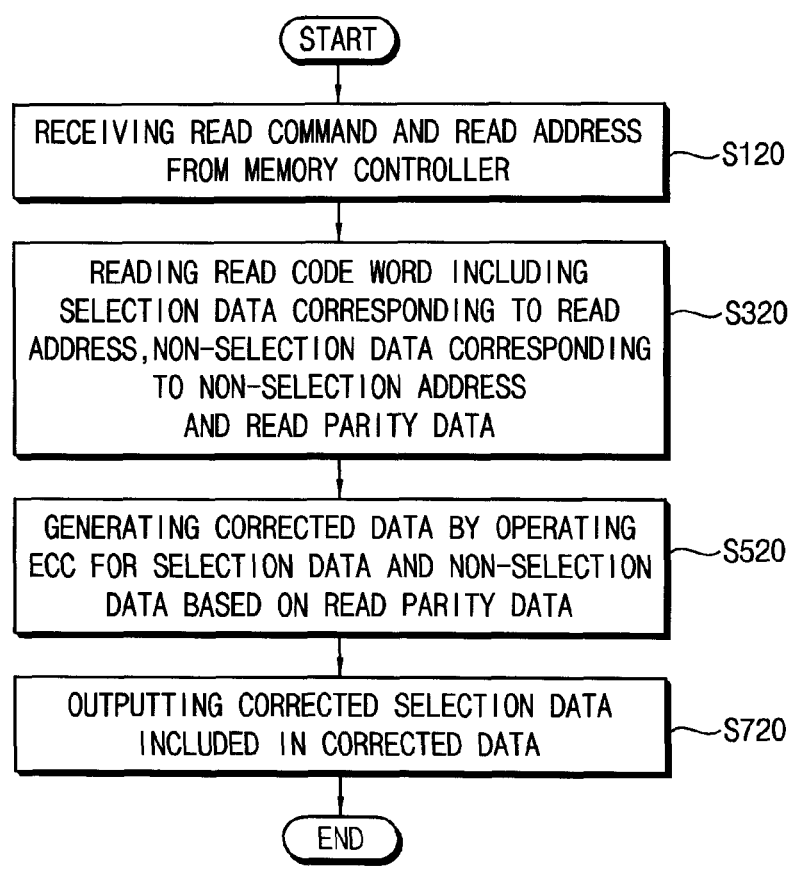
FIG. 18 is a flow chart illustrating a method of reading data in a memory device according to example embodiments.

FIG. 18 is a flow chart illustrating a method of reading data in a memory device according to example embodiments.

Referring to FIG. 18, in a method of reading data of the memory device 200, a read command CMD and a read address from a memory controller are received (S120).

A read code word (R_CW) including a selection data (SD) corresponding to the read address, a non-selection data (NSD) corresponding to a non-selection address (NS_ADDR) and a read parity data (R_PD) is read from a memory cell array 100 in the memory device 200 (S320). For example, the read address may be received from the memory controller and the non-selection address (NS_ADDR) may be determined by a method that is pre-programmed in the memory device 200.

In one embodiment, corrected data including a corrected selection data (CSD) and a corrected non-selection data (CNSD) is generated by performing the ECC using an ECC circuit for the selection data (SD) and the non-selection data (NSD) based on the read parity data (R_PD) in the memory device 200 (S520). For example, the hamming code may be used as the method of operating the ECC for the selection data (SD) and the non-selection data (NSD). In a case where the ECC is performed using the hamming code, for example, the number of the parity bits may be 5 bits if the number of the data bits is 16 bits, the number of the parity bits may be 6 bits if the number of the data bits is 32 bits or the number of the parity bits may be 7 bits if the number of the data bits is 64 bits.

The corrected selection data (CSD) included in the corrected data is outputted as a read data (S720). For example, the ECC circuit may include circuitry to correct errors of stored data based on the read address.

In an example embodiment, the corrected selection data (CSD) may be data that is error-corrected from the selection data (SD) corresponding to the read address.

In one embodiment, the method of reading data in the memory device 200 according to example embodiments may perform the ECC by reading the read code word (R_CW), of which the size is pre-determined, from the memory cell array 100 regardless of the operation mode. For example, in a case where the memory device 200 operates in ×4, ×8 or chop mode, the pre-determined size of the data may be read regardless of the operation mode of the memory device 200. As a result, the parity bit region may be assigned in the memory cell array 100 regardless of the operation mode. Therefore the overhead such that the parity bit region occupies the memory cell array 100 may be decreased and the memory cell array 100 may be used efficiently.

Figure 19:
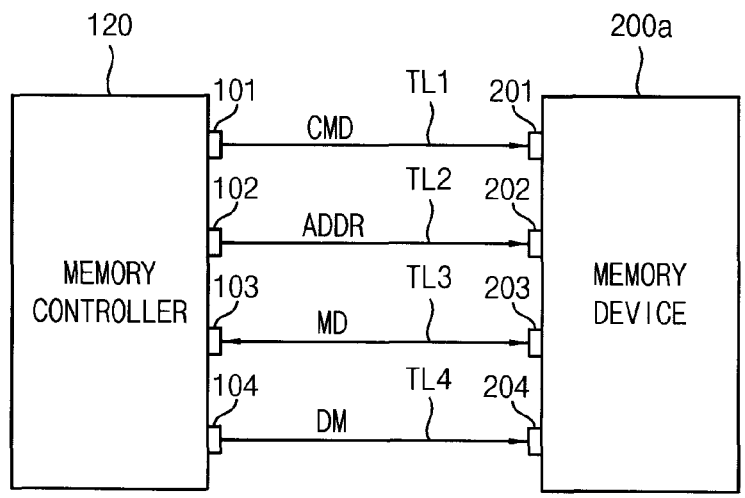
FIG. 19 is a block diagram illustrating a memory system according to example embodiments.

FIG. 19 is a block diagram illustrating a memory system according to example embodiments.

Referring to FIG. 19, the memory system includes a memory controller 120 and a semiconductor memory device 200a. The semiconductor memory device 200a may include the memory device disclosed herein according to example embodiments. Each of the memory controller 120 and the semiconductor memory device 200a may be formed as a separate semiconductor chip or as a separate group of chips (e.g., semiconductor memory device 200a may a stack of semiconductor chips in a semiconductor package). The memory controller 120 and the semiconductor memory device 200a may be connected to each other through corresponding command pins 101 and 201, corresponding address pins 102 and 202, corresponding data pins 103 and 203 and corresponding separate pins 104 and 204. The command pins 101 and 201 transmit a command signal CMD through a command transmission line TL1, the address pins 102 and 202 transmit an address signal ADDR through an address transmission line TL2, the data pins 103 and 203 exchange main data MD through a data transmission line TL3 and the separate pins 104 and 204 transmit a data mask signal DM through a separate transmission line TL4. The semiconductor memory device 200a performs partial updating operation in which the semiconductor memory device 200a writes some of the main data MD to the memory cell array in response to at least one of the data mask signal DM.

Figure 20:
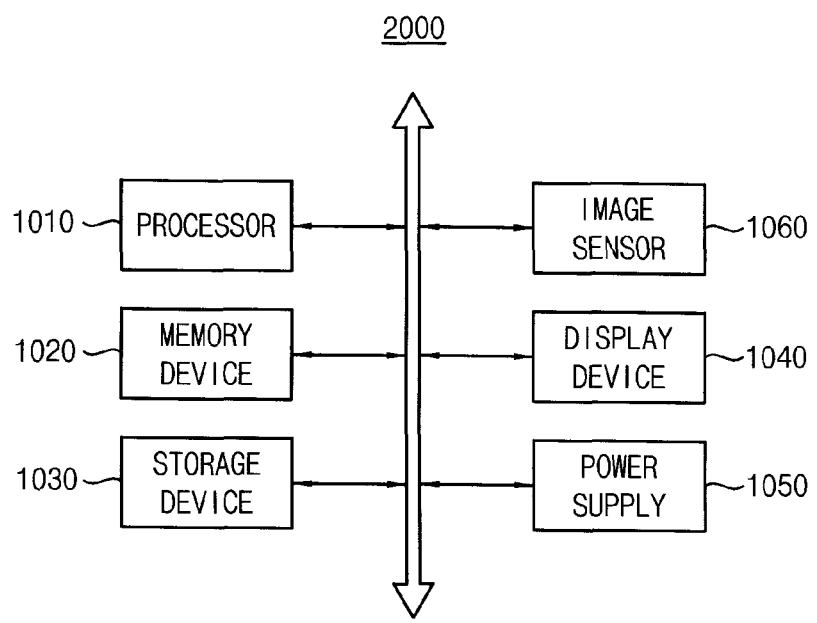
FIG. 20 is a block diagram illustrating an example of a computing system according to example embodiments.

FIG. 20 is a block diagram illustrating an example of a computing system according to example embodiments.

Referring to FIG. 20, computing system 2000 comprises a processor 1010, a memory device 1020, a storage device 1030, a display device 1040, a power supply 1050 and an image sensor 1060. The memory device 1020 may include the memory device disclosed herein according to example embodiments. The computing system 2000 may further comprise ports that communicate with a video card, a sound card, a memory card, a USB device, other electronic devices, etc.

Processor 1010 performs various calculations or tasks. According to some embodiments, processor 1010 may be a microprocessor or a CPU. Processor 1010 may communicate with memory device 1020, storage device 1030, and display device 1040 via an address bus, a control bus, and/or a data bus. In some embodiments, processor 1010 may be coupled to an extended bus, such as a peripheral component interconnection (PCI) bus. Memory device 1020 stores data for operating computing system 2000. The memory device 1020 may comprise, for instance, a dynamic random access memory (DRAM) device, a mobile DRAM device, a static random access memory (SRAM) device, a PRAM device, an FRAM device, an RRAM device, and/or an MRAM device. Memory device 1020 comprises the data loading circuit according to example embodiments as described with reference to FIGS. 1 through 13.

Storage device 1030 may comprise, for example, a solid state drive (SSD), a hard disk drive (HDD), a CD-ROM, etc. Computing system 2000 may further comprise an input device such as a touchscreen, a keyboard, a keypad, a mouse, etc., and an output device such as a printer, a display device, etc. Power supply 1050 supplies operation voltages for computing system 2000.

Image sensor 1060 may communicate with processor 1010 via the buses or other communication links. Image sensor 1060 can be integrated with processor 1010 in one chip, or image sensor 1060 and processor 1010 may be implemented as separate chips.

At least a portion of computing system 2000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP). Computing system 2000 may be a computing system using a data loading circuit, e.g., a digital camera, a mobile phone, a smart phone, a portable multimedia player (PMP), a personal digital assistant (PDA), a computer, etc.

In one embodiment, the method of operating the memory device 1020 of the computing system 2000 according to example embodiments may perform the ECC by reading the read code word, of which the size is pre-determined, from a memory cell array of the memory device 1020 regardless of the operation mode. For example, in case the memory device operates in ×4, ×8 or chop mode, the pre-determined size of the data may be read regardless of the operation mode of the memory device. The parity bit region may be assigned in the memory cell array regardless of the operation mode. Therefore the overhead such that the parity bit region occupies the memory cell array may be decreased and the memory cell array may be used efficiently.

Figure 21:
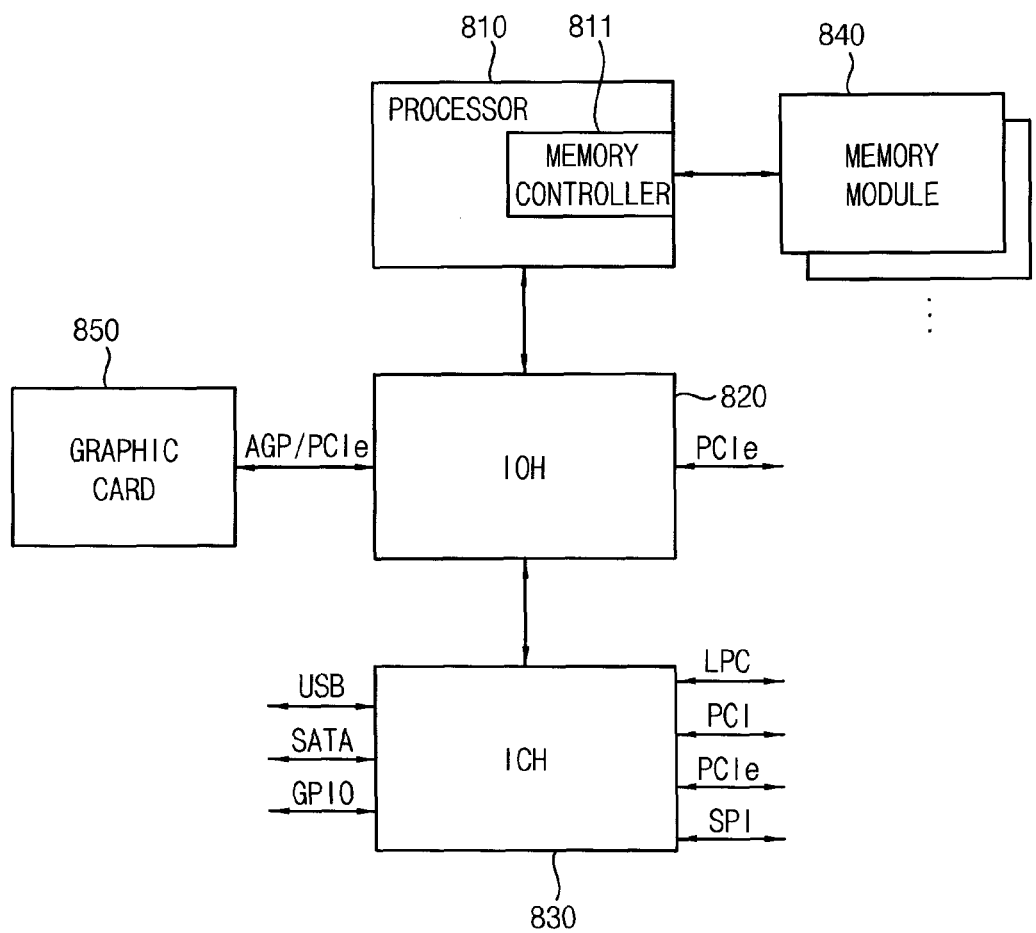
FIG. 21 is a block diagram illustrating another example of the computing system according to example embodiments.

FIG. 21 is a block diagram illustrating another example of the computing system according to example embodiments.

Referring to FIG. 21, a computing system 800 includes a processor 810, an input/output hub (IOH) 820, an input/output controller hub (ICH) 830, at least one memory module 840 and a graphics card 850. In some embodiments, the computing system 800 may be, for example, a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. Although FIG. 20 illustrates the computing system 800 including one processor 810, in some embodiments, the computing system 800 may include a plurality of processors. The processor 810 may include an internal or external cache memory.

The processor 810 may include a memory controller 811 for controlling operations of the memory module 840. The memory controller 811 included in the processor 810 may be referred to as an integrated memory controller (IMC). The memory controller 811 may include structure and/or perform the methods of one or more of the embodiments described herein. A memory interface between the memory controller 811 and the memory module 840 may be implemented with a single channel including a plurality of signal lines, or may bay be implemented with multiple channels, to each of which at least one memory module 840 may be coupled. In some embodiments, the memory controller 811 may be located in the input/output hub 820, which may be referred to as memory controller hub (MCH).

The memory module 840 may include a plurality of memory devices that store data provided from the memory controller 811. The memory module 840 may employ one of the memory devices explained with reference to FIGS. 2 through 17. The memory module 840 includes a first set of memory devices in a first rank, directly connected to the memory controller 811 and a second set of memory devices in at least a second rank, each connected to the memory controller 811 via associated one of the memory devices of the first set of memory devices. Therefore, the memory controller 811 needs to bear a loading of the memory device in a first rank when the memory controller 811 transmits/receives data. Therefore, the memory module 840 may increase the number of ranks without reducing operation speed.

The input/output hub 820 may manage data transfer between processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a QuickPath interconnect (QPI), a common system interface (CSI), etc. Although FIG. 40 illustrates the computing system 800 including one input/output hub 820, in some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not shown) for displaying an image. The graphics card 850 may include an internal processor for processing image data and an internal memory device. In some embodiments, the input/output hub 820 may include an internal graphics device along with or instead of the graphics card 850 outside the graphics card 850. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration to efficiently operate various system interfaces. The input/output controller hub 830 may be coupled to the input/output hub 820 via an internal bus, such as a direct media interface (DMI), a hub interface, an enterprise southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller hub 830 may be implemented as a single chipset.

In one embodiment, a method of operating the memory device of the computing system 800 according to example embodiments may perform the ECC by reading the read code word, of which the size is pre-determined, from a memory cell array of the memory device regardless of the operation mode. For example, in case the memory device operates in ×4, ×8 or chop mode, the pre-determined size of the data may be read regardless of the operation mode of the memory device. The parity bit region may be assigned in the memory cell array regardless of the operation mode. Therefore the overhead such that the parity bit region occupies the memory cell array may be decreased and the memory cell array may be used efficiently.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present disclosure as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of operating a memory device, the method comprising:
   receiving a write command, write data and a first address from a memory controller;
   in response to receiving the write command, reading a read code word from a memory cell array of the memory device, the read code word including a first set of data corresponding to the first address, a second set of data corresponding to a second address, and a read parity data; and
   generating corrected data by performing error checking and correction (ECC) using an ECC circuit based on the read cord word, the corrected data including a first portion corresponding to the first set of data and a second portion corresponding to the second set of data;
   generating a write code word including the write data, the second portion of corrected data and write parity data generated from the write data and the second portion of corrected data; and
   storing the write code word in the memory cell array.

2. The method of claim 1, wherein the second address is internally determined in the memory device based on the first address, and has a different bank address, row address or column address from the first address.

3. The method of claim 1, wherein the size of the second set of data is equal to or greater than the size of the first set of data.

4. The method of claim 1, wherein the size of the read code word is fixed when an operation mode of the memory device is changed.

5. A method of performing a write operation for a memory device, the method comprising:
   receiving a write command, a write address and a write data from a memory controller;
   reading a read code word from a memory cell array of the memory device, the read code word including a selection data corresponding to the write address, a non-selection data corresponding to a non-selection address generated based on the write address, and a read parity data;
   generating corrected data including a corrected selection data and a corrected non-selection data by performing error checking and correction (ECC) for the selection data and the non-selection data based on the read parity data using an ECC circuit;
   generating a write parity data by encoding the write data and the corrected non-selection data; and
   writing a write code word including the write data, the corrected non-selection data, and the write parity data in the memory cell array.

6. The method of claim 5, wherein the write code word is generated by replacing a portion of the corrected data with the write data, the portion corresponding to the corrected selection data.

7. The method of claim 5, wherein a time interval between read signals in a case where the memory device sequentially performs read operations is shorter than a time interval between write signals in a case where the memory device sequentially performs write operations.

8. The method of claim 5, wherein the write code word is written in a plurality of bank groups included in the memory device by an interleaving scheme.

9. The method of claim 5, wherein tCCD_L is less than (tCCD_S*NBG) in the write operation of the memory device, tCCD_L being a time interval between write commands in a case where the memory device sequentially performs write operations in the same memory bank group, tCCD_S being a time interval between the write commands in a case where the memory device sequentially performs write operations in a plurality of bank groups by interleaving scheme, and NBG being the number of the bank groups.

10. The method of claim 5, wherein a bank group address is assigned to lower bits of the write address than a column address in address mapping.

11. The method of claim 5, wherein the non-selection address is internally determined in the memory device based on the write address, and has a different bank address, row address or column address from the write address.

12. A method of operating a memory device including a memory cell array divided into a data bit region and a parity bit region, the method comprising:
- receiving a write command, write data and a first address from a memory controller;
- in response to receiving the write command, reading a first set of data from a selected data bit region corresponding to the first address received from a memory controller, a second set of data from a non-selected data bit region corresponding to a second address different from the first address, and a read parity data from the parity bit region; and
- generating corrected data by performing an operation of error checking and correction (ECC) using an ECC circuit based on the read parity data and the first and second sets of data, the corrected data including a corrected selection data corresponding to the first set of data and a corrected non-selection data corresponding to the second set of data;
- generating a write code word including the write data, the second portion of corrected data and write parity data generated from the write data and the second portion of corrected data; and
- storing the write code word in the memory cell array.

13. The method of claim 12, further comprising:
- outputting the corrected data as read data to corresponding data PO buffers each connected to a respective DQ pad.

14. The method of claim 13, wherein the selected data bit region includes n sets of data bit regions connected to the ECC circuit, each of the n sets of data bit regions corresponding to the respective DQ pad, n being an integer greater than 2.

15. The method of claim 14, wherein the non-selected data bit region includes m sets of data bit regions connected to the ECC circuit, each of the m sets of data bit regions corresponding to the respective DQ pad, m being equal to or greater than n.

16. The method of claim 15, wherein the second address is generated in the memory device based on the first address, and has a different bank address, row address or column address from the first address.

17. The method of claim 12, wherein a size of the read parity data is predetermined regardless of a size of the first set of data from the selected data bit region.

* * * * *